(12) United States Patent
Spiro

(10) Patent No.: US 12,352,421 B2
(45) Date of Patent: Jul. 8, 2025

(54) ORIENTATION SPECIFIC OPTICS FOR ELONGATED MODULAR HEAT SINK WITH COUPLED LAMP

(71) Applicant: Exposure Illumination Architects, Inc., Scottsdale, AZ (US)

(72) Inventor: Daniel S. Spiro, Scottsdale, AZ (US)

(73) Assignee: EXPOSURE ILLUMINATION ARCHITECTS, INC., Scottsdale, AZ (US)

( * ) Notice: Subject to any disclaimer, the term of this patent is extended or adjusted under 35 U.S.C. 154(b) by 0 days.

(21) Appl. No.: 18/906,728

(22) Filed: Oct. 4, 2024

(65) Prior Publication Data

US 2025/0027641 A1 Jan. 23, 2025

Related U.S. Application Data

(63) Continuation-in-part of application No. 18/798,429, filed on Aug. 8, 2024, now Pat. No. 12,247,730,
(Continued)

(51) Int. Cl.
| | |
|---|---|
| *F21V 29/74* | (2015.01) |
| *F21K 9/27* | (2016.01) |
| *F21V 5/04* | (2006.01) |
| *F21V 15/01* | (2006.01) |
| *F21V 23/00* | (2015.01) |
| *F21V 23/04* | (2006.01) |

(Continued)

(52) U.S. Cl.
CPC .............. *F21V 29/74* (2015.01); *F21K 9/27* (2016.08); *F21V 15/01* (2013.01); *F21V 23/003* (2013.01); *F21V 23/0478* (2013.01); *F21V 29/773* (2015.01); *H05B 45/20* (2020.01); *H05B 47/125* (2020.01); *F21V 5/04* (2013.01); *F21Y 2103/10* (2016.08); *F21Y 2113/10* (2016.08); *F21Y 2115/10* (2016.08); *H10H 20/8582* (2025.01)

(58) Field of Classification Search
CPC ........ F21V 29/74; F21V 29/773; F21V 15/01; F21V 23/003; F21V 23/0478; F21K 29/773; F21K 9/27; H05B 45/20; H05B 47/125
See application file for complete search history.

(56) References Cited

U.S. PATENT DOCUMENTS

| | | | |
|---|---|---|---|
| 5,687,527 A | 11/1997 | Bikard et al. | |
| 6,210,018 B1 * | 4/2001 | Kassay | F21V 15/01 |
| | | | 362/225 |

(Continued)

FOREIGN PATENT DOCUMENTS

| | | |
|---|---|---|
| CN | 103244916 A | 8/2013 |
| DE | 202011003828 U1 | 5/2011 |

(Continued)

OTHER PUBLICATIONS

Extended Search Report issued in Appl. No. EP19808191 (Jan. 27, 2022).

(Continued)

*Primary Examiner* — Bryon T Gyllstrom
(74) *Attorney, Agent, or Firm* — XSENSUS LLP

(57) ABSTRACT

Lensed optics for a modular linear light emitting device for precisely illuminating vertical and horizontal surfaces where needed at the required light intensity and uniformity ratio/s.

20 Claims, 23 Drawing Sheets

Related U.S. Application Data which is a continuation-in-part of application No. 18/436,081, filed on Feb. 8, 2024, now Pat. No. 12,085,274, which is a continuation-in-part of application No. 18/401,448, filed on Dec. 30, 2023, now Pat. No. 12,038,170, which is a continuation-in-part of application No. 18/381,231, filed on Oct. 18, 2023, now Pat. No. 11,901,718, application No. 18/906,728 is a continuation-in-part of application No. 18/197,104, filed on May 15, 2023, now Pat. No. 12,130,000, which is a continuation-in-part of application No. 17/397,508, filed on Aug. 9, 2021, now Pat. No. 11,680,702, which is a continuation-in-part of application No. 16/672,218, filed on Nov. 1, 2019, now Pat. No. 11,085,627, which is a continuation-in-part of application No. PCT/US2019/033152, filed on May 20, 2019, which is a continuation of application No. 16/019,329, filed on Jun. 26, 2018, now Pat. No. 10,502,407.

(60) Provisional application No. 63/548,311, filed on Nov. 13, 2023, provisional application No. 62/674,431, filed on May 21, 2018.

(51) Int. Cl.

| | |
|---|---|
| *F21V 29/77* | (2015.01) |
| *F21Y 103/10* | (2016.01) |
| *F21Y 113/10* | (2016.01) |
| *F21Y 115/10* | (2016.01) |
| *H05B 45/20* | (2020.01) |
| *H05B 47/125* | (2020.01) |
| *H10H 20/858* | (2025.01) |

(56) References Cited

U.S. PATENT DOCUMENTS

| | | |
|---|---|---|
| 6,428,183 B1 | 8/2002 | McAlpin |
| 7,959,319 B2 | 6/2011 | Chien |
| 8,246,209 B2 | 8/2012 | Lai |
| 8,287,144 B2 | 10/2012 | Pedersen et al. |
| 8,408,742 B2 | 4/2013 | Tran |
| 8,419,223 B2 | 4/2013 | Withers |
| 8,454,192 B2 | 6/2013 | Rouse et al. |
| 8,864,511 B2 | 10/2014 | Shimizu et al. |
| 8,899,778 B2 | 12/2014 | Yang et al. |
| 8,998,441 B2 | 4/2015 | Kim |
| 9,228,708 B2 | 1/2016 | Dings et al. |
| 9,267,650 B2 | 2/2016 | Simon et al. |
| 9,574,717 B2 | 2/2017 | Scapa et al. |
| 9,644,800 B2 | 5/2017 | Purdy |
| 9,644,828 B1 | 5/2017 | May |
| 9,846,272 B2 | 12/2017 | Dau et al. |
| 10,047,943 B2 | 8/2018 | Storey et al. |
| 10,125,946 B2 | 11/2018 | Meerbeek et al. |
| 10,203,103 B2 | 2/2019 | Bendtsen et al. |
| 10,323,824 B1* | 6/2019 | Lim ................. F21V 5/02 |
| 10,378,742 B1 | 8/2019 | Rao |
| 10,458,638 B1 | 10/2019 | Tirosh |
| 10,551,046 B1 | 2/2020 | Tang |
| 10,845,034 B2 | 11/2020 | Nichols et al. |
| 11,432,477 B2 | 9/2022 | Wu et al. |
| 2002/0167282 A1 | 11/2002 | Kirkpatrick et al. |
| 2006/0002110 A1* | 1/2006 | Dowling ............ H05B 45/3578 |
| | | 362/249.05 |
| 2008/0037239 A1 | 2/2008 | Thomas et al. |
| 2008/0158870 A1 | 7/2008 | Sun et al. |
| 2008/0314944 A1 | 12/2008 | Tsai et al. |
| 2009/0190350 A1 | 7/2009 | Tseng et al. |
| 2010/0002426 A1 | 1/2010 | Wu et al. |
| 2010/0079075 A1 | 4/2010 | Son |
| 2010/0270933 A1* | 10/2010 | Chemel ................. H05B 47/155 |
| | | 315/130 |
| 2010/0296285 A1* | 11/2010 | Chemel ..................... F21S 9/02 |
| | | 362/249.1 |
| 2010/0301773 A1 | 12/2010 | Chemel et al. |
| 2010/0309652 A1 | 12/2010 | Shen et al. |
| 2011/0075416 A1 | 3/2011 | Chou et al. |
| 2011/0141723 A1 | 6/2011 | Lai et al. |
| 2011/0141724 A1 | 6/2011 | Erion |
| 2011/0235318 A1 | 9/2011 | Simon et al. |
| 2011/0286208 A1 | 11/2011 | Chen |
| 2011/0304270 A1 | 12/2011 | Scarpelli |
| 2012/0026729 A1 | 2/2012 | Sanchez et al. |
| 2012/0201024 A1 | 8/2012 | van de Ven |
| 2012/0212953 A1 | 8/2012 | Bloom et al. |
| 2012/0218757 A1 | 8/2012 | Gill |
| 2012/0235579 A1* | 9/2012 | Chemel ................... F21V 15/01 |
| | | 315/152 |
| 2012/0307503 A1* | 12/2012 | Wilcox ................... F21V 13/02 |
| | | 362/308 |
| 2013/0003346 A1 | 1/2013 | Letoquin et al. |
| 2013/0039041 A1 | 2/2013 | Yeh et al. |
| 2013/0050998 A1 | 2/2013 | Chu et al. |
| 2013/0093325 A1 | 4/2013 | Scarpelli |
| 2013/0119896 A1 | 5/2013 | Fukano et al. |
| 2013/0148351 A1 | 6/2013 | Georgitsis et al. |
| 2013/0182422 A1 | 7/2013 | Guilmette |
| 2014/0063795 A1 | 3/2014 | Hoffmann et al. |
| 2014/0126190 A1 | 5/2014 | Dixon et al. |
| 2014/0313711 A1 | 10/2014 | Hwu et al. |
| 2015/0116997 A1 | 4/2015 | Tappert et al. |
| 2015/0211710 A1 | 7/2015 | Speier |
| 2015/0300617 A1 | 10/2015 | Katona et al. |
| 2015/0345743 A1 | 12/2015 | Trincia et al. |
| 2016/0195250 A1 | 7/2016 | Park |
| 2016/0201883 A1 | 7/2016 | Sorensen et al. |
| 2016/0323974 A1 | 11/2016 | Spiro et al. |
| 2016/0348855 A1* | 12/2016 | Zampini ............ G02B 19/0014 |
| 2017/0023193 A1 | 1/2017 | Thosteson et al. |
| 2017/0175953 A1* | 6/2017 | Van Boven ................ F21K 9/65 |
| 2017/0175961 A1 | 6/2017 | Martin |
| 2017/0184284 A1 | 6/2017 | Van Winkle |
| 2017/0254493 A1 | 9/2017 | Giorgini et al. |
| 2017/0257925 A1* | 9/2017 | Forbis ..................... F21V 29/74 |
| 2017/0301375 A1 | 10/2017 | Mayhall |
| 2018/0003351 A1 | 1/2018 | Van Winkle |
| 2018/0231200 A1* | 8/2018 | Hierzer ................... F21V 29/83 |
| 2018/0292071 A1* | 10/2018 | Tarsa ........................ F21V 5/08 |
| 2019/0353341 A1 | 11/2019 | Spiro |
| 2021/0033272 A1 | 2/2021 | Spiro |

FOREIGN PATENT DOCUMENTS

| | | |
|---|---|---|
| EP | 2821695 A1 | 1/2015 |
| EP | 3217090 A1 | 9/2017 |
| JP | 2016-157700 A | 9/2016 |
| KR | 20110101592 A | 9/2011 |
| KR | 20120021050 A | 3/2012 |
| WO | 2013/090536 A1 | 6/2013 |
| WO | 2017/066642 A1 | 4/2017 |
| WO | 2017/108446 A1 | 6/2017 |

OTHER PUBLICATIONS

Extended Search Report issued in Appl. No. EP20205197.5 (Mar. 5, 2021).

Examination Report issued in Appl. No. EP20205197.5 (Jun. 27, 2022).

* cited by examiner

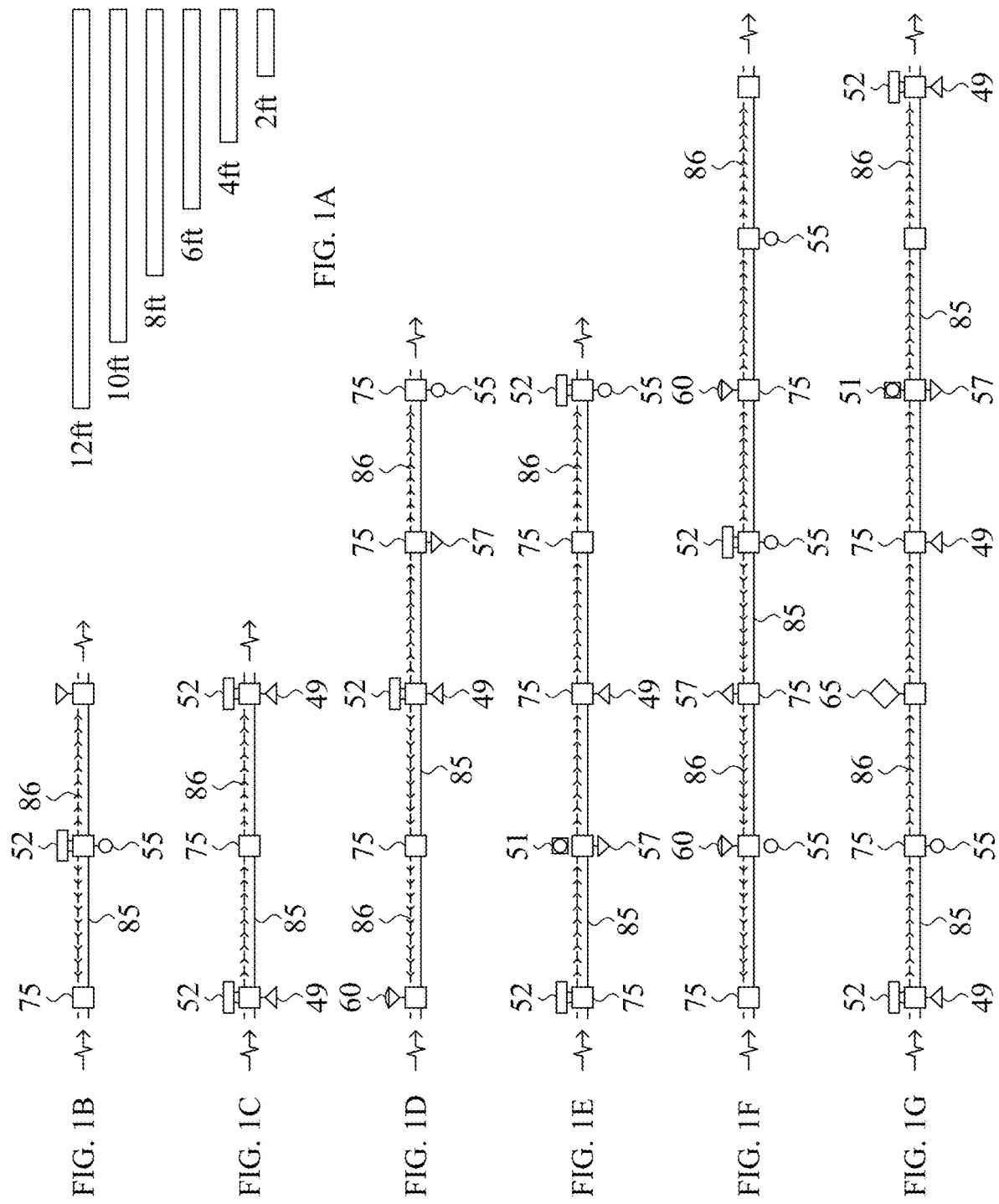

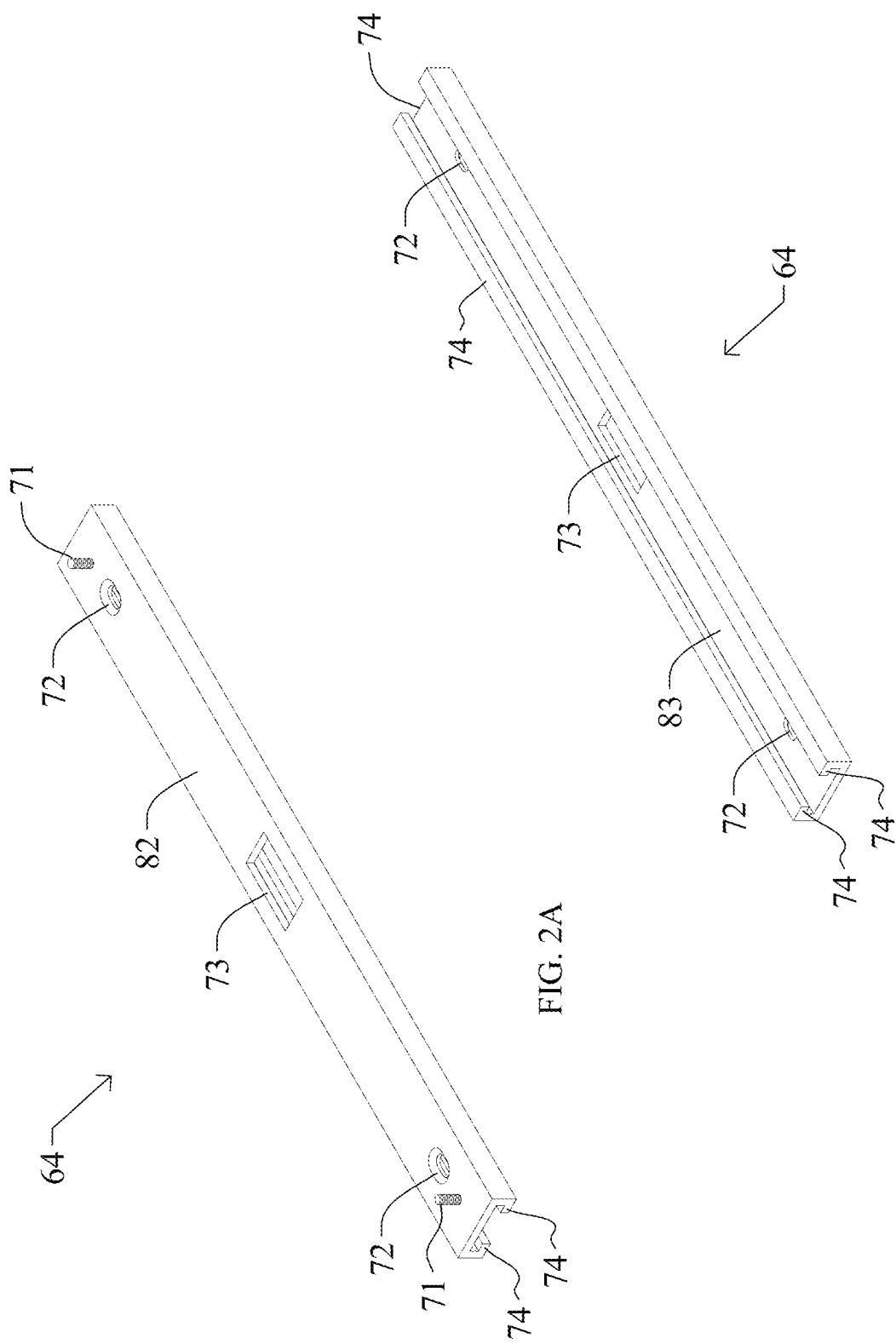

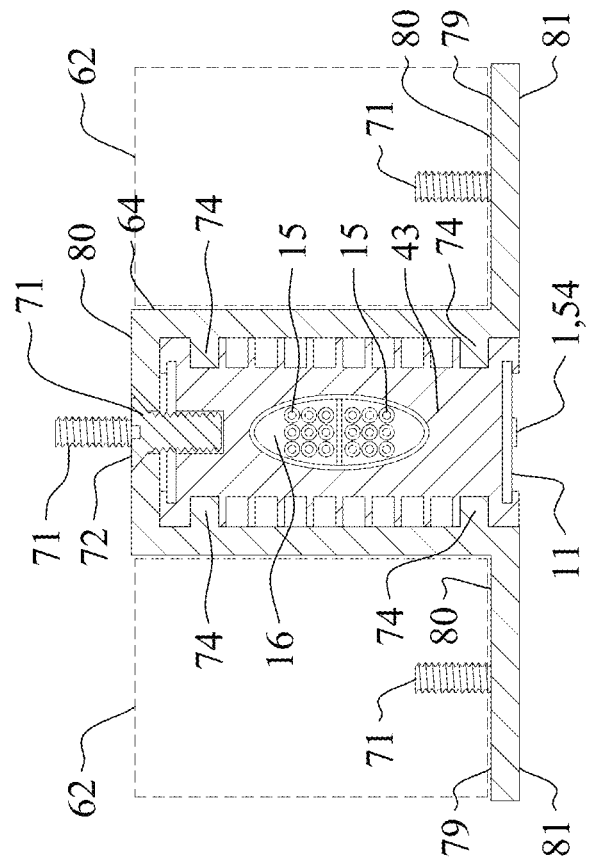
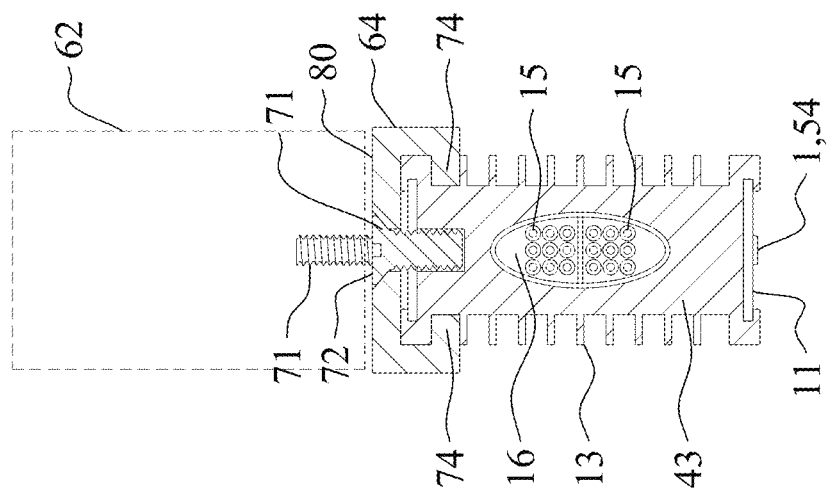
FIG. 5A
FIG. 5B

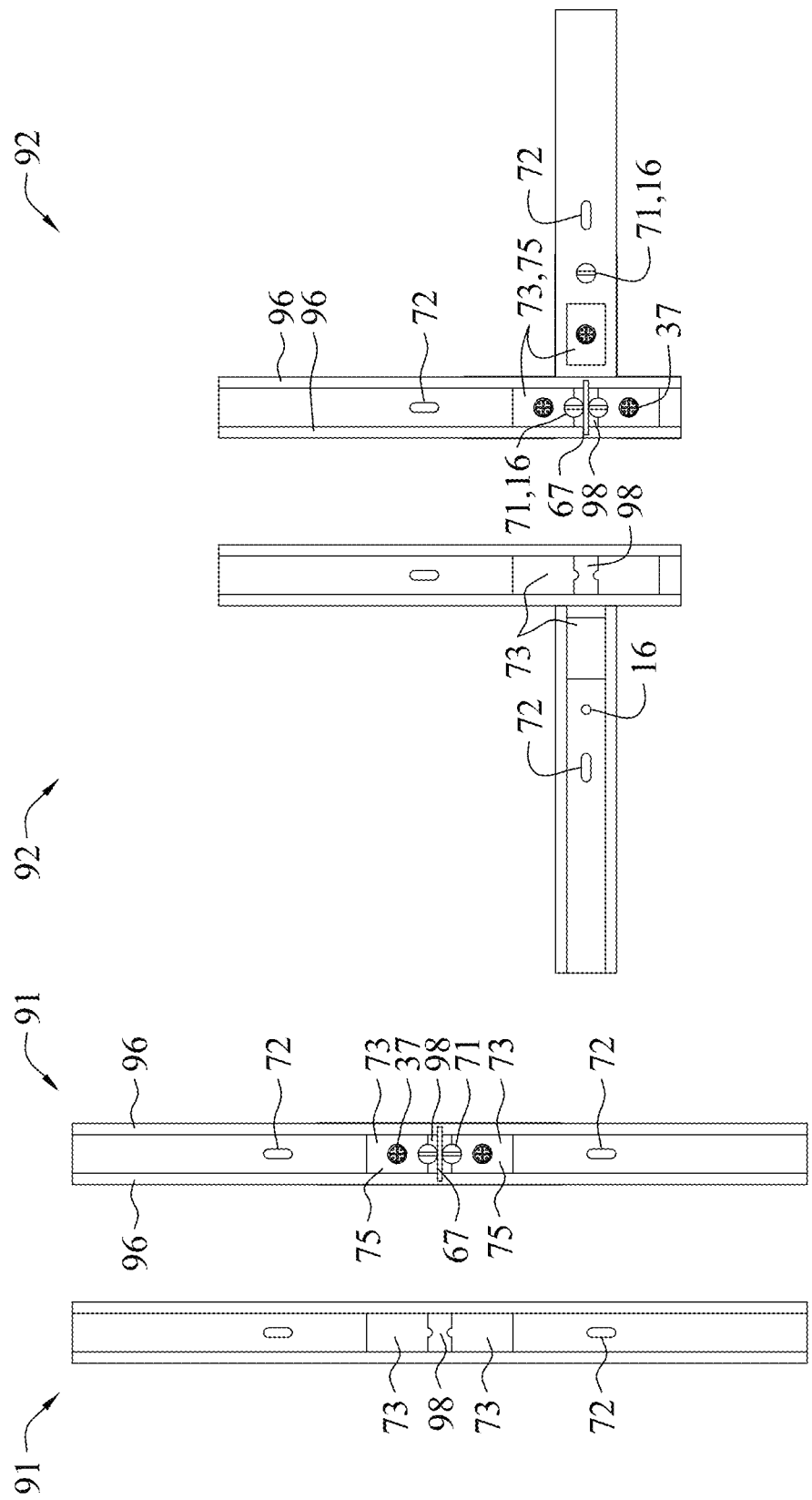

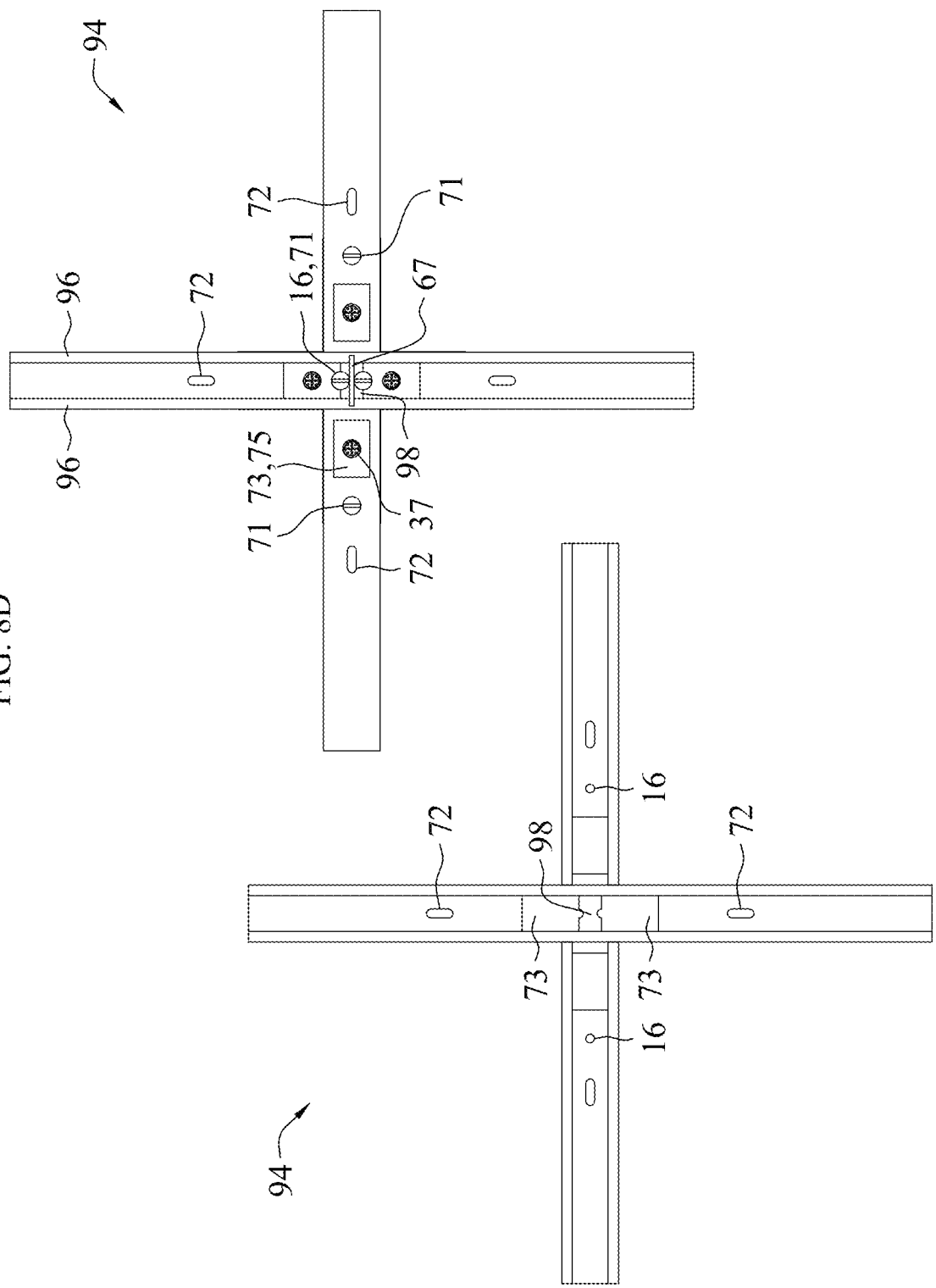

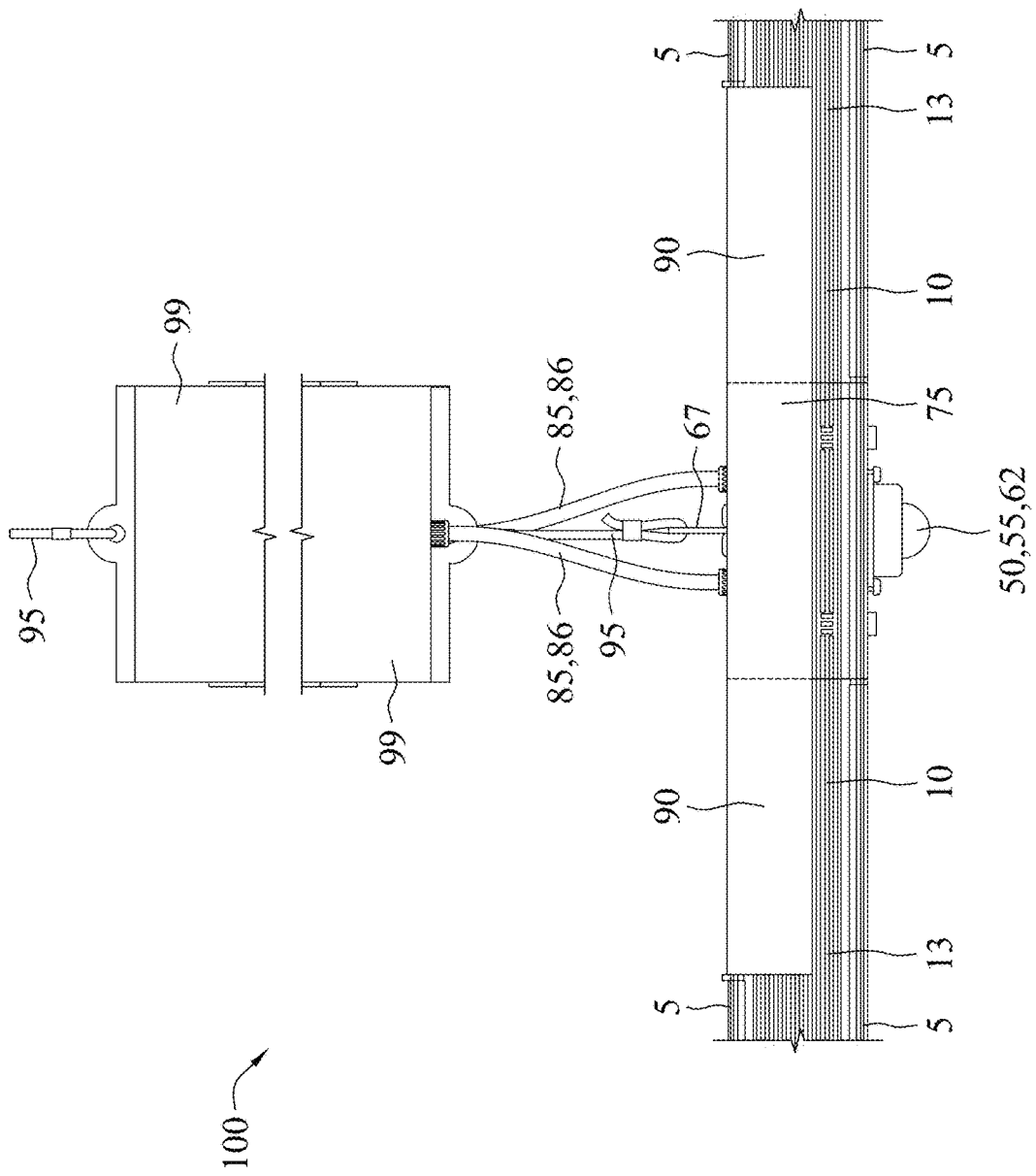

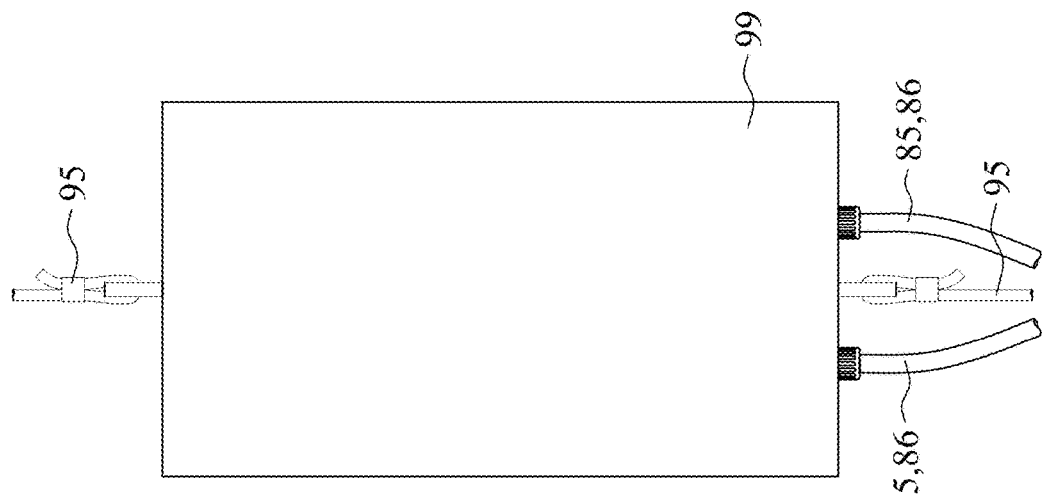
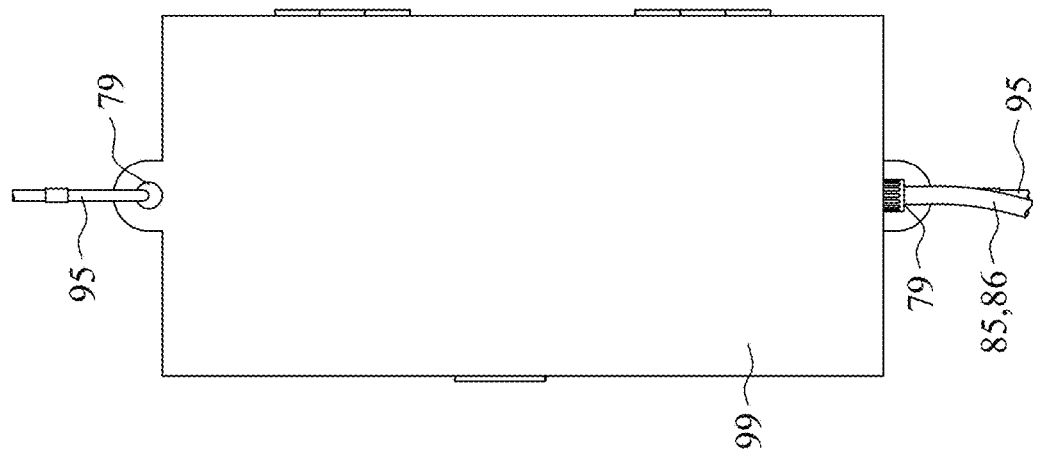

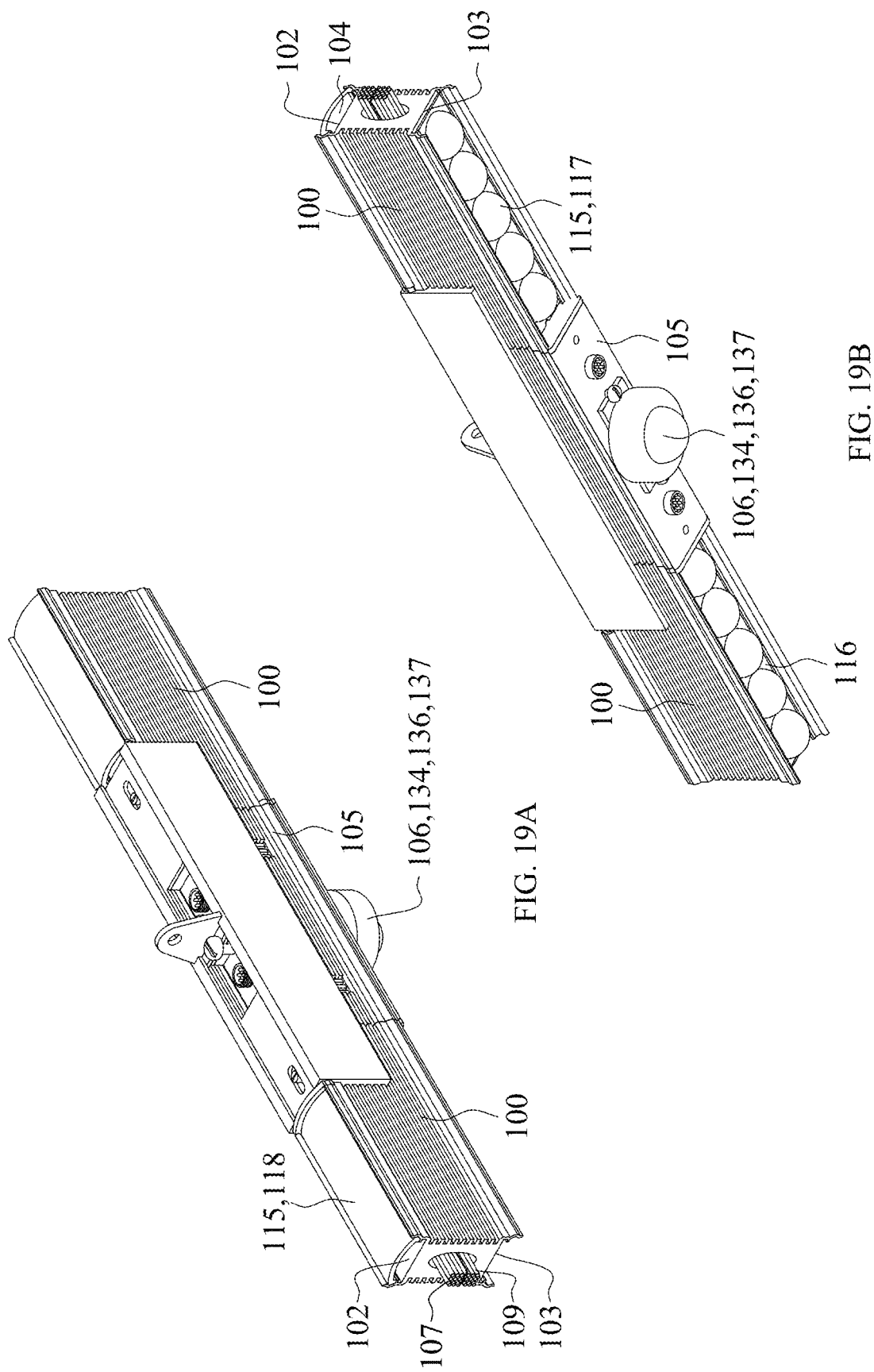

ORIENTATION SPECIFIC OPTICS FOR ELONGATED MODULAR HEAT SINK WITH COUPLED LAMP

CROSS-REFERENCE TO RELATED APPLICATIONS

This application is a continuation-in-part of two co-pending applications. Moreover, this application is a continuation-in-part of co-pending U.S. Utility patent application Ser. No. 18/197,104 ("the parent application") entitled "ELONGATED MODULAR HEAT SINK WITH COUPLED LIGHT SOURCE", filed May 15, 2023, which is a continuation-in-part of earlier filed U.S. Utility patent application Ser. No. 17/397,508 (now U.S. Pat. No. 11,680, 702) ("the parent application") entitled "ELONGATED MODULAR HEAT SINK WITH COUPLED LIGHT SOURCE", filed Aug. 9, 2021, which is a continuation-in-part of the earlier filed U.S. Utility patent application entitled "ELONGATED MODULAR HEATSINK WITH COUPLED LIGHT SOURCE LUMINAIRE," Ser. No. 16/672,218 (now U.S. Pat. No. 11,085,627), filed Nov. 1, 2019, which is a continuation-in-part of International Patent Application entitled "ELONGATED MODULAR HEATSINK WITH COUPLED LIGHT SOURCE LUMINAIRE," international application number PCT/US19/33152, filed May 20, 2019, which is a Continuation-in-Part of U.S. Utility patent application entitled "HEAT SINK WITH BI-DIRECTIONAL LED LIGHT SOURCE," Ser. No. 16/019, 329 (now U.S. Pat. No. 10,502,407), filed Jun. 26, 2018, and claims priority to U.S. Provisional patent application to "HEAT SINK WITH BI-DIRECTIONAL LED LIGHT SOURCE," Ser. No. 62/674,431, filed May 21, 2018; and U.S. patent application Ser. No. 16/019,329 (now U.S. Pat. No. 10,502,407), filed Jun. 26, 2018, and claims priority to U.S. Provisional patent application Ser. No. 62/674,431, filed May 21, 2018. This application is also a continuation-in-part of co-pending U.S. Utility patent application Ser. No. 18/798,429, filed Aug. 8, 2024, which is a Continuation in-part of U.S. Utility patent application Ser. No. 18/436,081 (now U.S. Utility U.S. Pat. No. 12,085,274), filed Feb. 8, 2024, which is a continuation-in-part of U.S. Utility patent application Ser. No. 18/401,448 (now U.S. Pat. No. 12,038, 170), filed Dec. 30, 2023, which claims the benefit of the earlier filing date of U.S. provisional application No. 63/548, 311, filed Nov. 13, 2023. Co-pending U.S. Utility patent application Ser. No. 18/401,448 is a continuation-in-part of U.S. Utility patent application Ser. No. 18/381,231 (now U.S. Pat. No. 11,901,718), filed Oct. 18, 2023. The disclosures set forth in the above-referenced applications and patents are incorporated herein by reference in their entireties.

TECHNICAL FIELD

The present disclosure generally relates to an electromechanical means to connect an elongated heat sink to an array of like heat sinks wherein each heat sink is coupled to at least one light source. More particularly, the present disclosure relates to a modular, reduced profile, power or power data conveying heatsink module array with coupled light sources configured to extend a long distance with power access at one end of the array and adaptable light source lens optics for a wide range of mounting heights. The present disclosure also relates to lens optics that allow for the control of directionality and intensity of light emitted from a planar lamp under the lens that is coupled to an elongated modular heatsink (EMHS).

BACKGROUND

Traditional heat sink designs use excessive amounts of material and are energy inefficient, resulting in high construction, maintenance, and operation costs. Moreover, traditional heat sinks form factor is not easily scalable, nor adaptable to various mounting heights. Also, light sources suspended from a ceiling (or other overhead structure) provide wide dispersion light to cover as much area as possible. To the extent lens optics are used, they are used to direct light in along a primary axis of the structure on which the lamp(s) is mounted.

SUMMARY

In one exemplary embodiment an elongated heatsink array is described that includes a first heatsink module and a second heat sink module that are members of an array of heat sink modules and each is unitarily fabricated and displays a solid heatsink core with a longitudinal opening extending from end to end with at least one conductor extending inside from end to end, ends of the at least one conductor couple to a connector that couples to a reciprocating connector disposed on a surface of a device receptacle. A joiner is included and the device receptacle which is coupled to the joiner is configured to convey at least a portion of power from the first heatsink module to the second heatsink module. A power supply is coupled to a power line source. A support structure includes a harness and a housing and is supported from a structure above, the support housing of the support structure retains the power supply, and at least one of the first heatsink module and the joiner are distally supported mechanically from above by the support structure. A power conductor that is coupled at to the power supply and also coupled to at least one distally located receptacle disposed on a surface of the device receptacle, wherein a portion of power that enters the first heatsink module is conveyed through the device receptacle from the power supply provides power to at least one power consuming device coupled to at least one of the first heatsink module, the second heatsink module or a device receptacle. Another portion of the power that enters the first heatsink module continues through the device receptacle to at least the second heat sink module The EMHS is configured to dissipate heat generated by at least one coupled light source. The light source may include many lamps, such as an array of LED lamps. The light source can couple to at least one of a top and a bottom surface of the EMHS. The EMHS is configured to have at least one longitudinal through opening. Power or power and data conductors extend through the longitudinal through opening from one end of the EMHS to the other. The sections of the EMHS can couple end-to-end with one another or can have a device receptacle between them.

The device receptacle is configured to enable the conveyance of through-power or power and data, from one EMHS section to another EMHS section. The device receptacle is also configured to tap into at least one power conductor conveying through power to energize at least one power consuming device. The power consuming device can be coupled to the device receptacle, such as a camera, an occupancy sensor and/or an egress light source, a communication device, and a processing device.

In a different exemplary embodiment, the device receptacle can convey power to a light source coupled to the EMHS. In yet another exemplary embodiment, the device receptacle can convey and receive power and data to and from a power consuming device external to the EMHS linear system.

In U.S. patent application Ser. No. 18/197,104, and other cited patent documents cited in the Cross Reference to Related Applications, the present inventor described the EMHS system's features. The present disclosure further describes additional optical properties associated with an optical lens configured to control the directionality and intensity of light emitted by at least one light source coupled to the EMHS.

BRIEF DESCRIPTION OF THE DRA WINGS

The detailed description particularly refers to the following figures, in which:

FIG. 1A illustrates typical length of heat sink modules;

FIGS. 1B, 1C, 1D, 1E, 1F, and 1G illustrate conceptual circuitry diagrams of several power distribution configurations of the heat sink array;

FIGS. 2A and 2B illustrate perspective views of the plate joiner;

FIGS. 5A and 5B illustrate transverse cross-section views of the heat sink assembly, plate joiner, and saddle joiner;

Figure 8C:
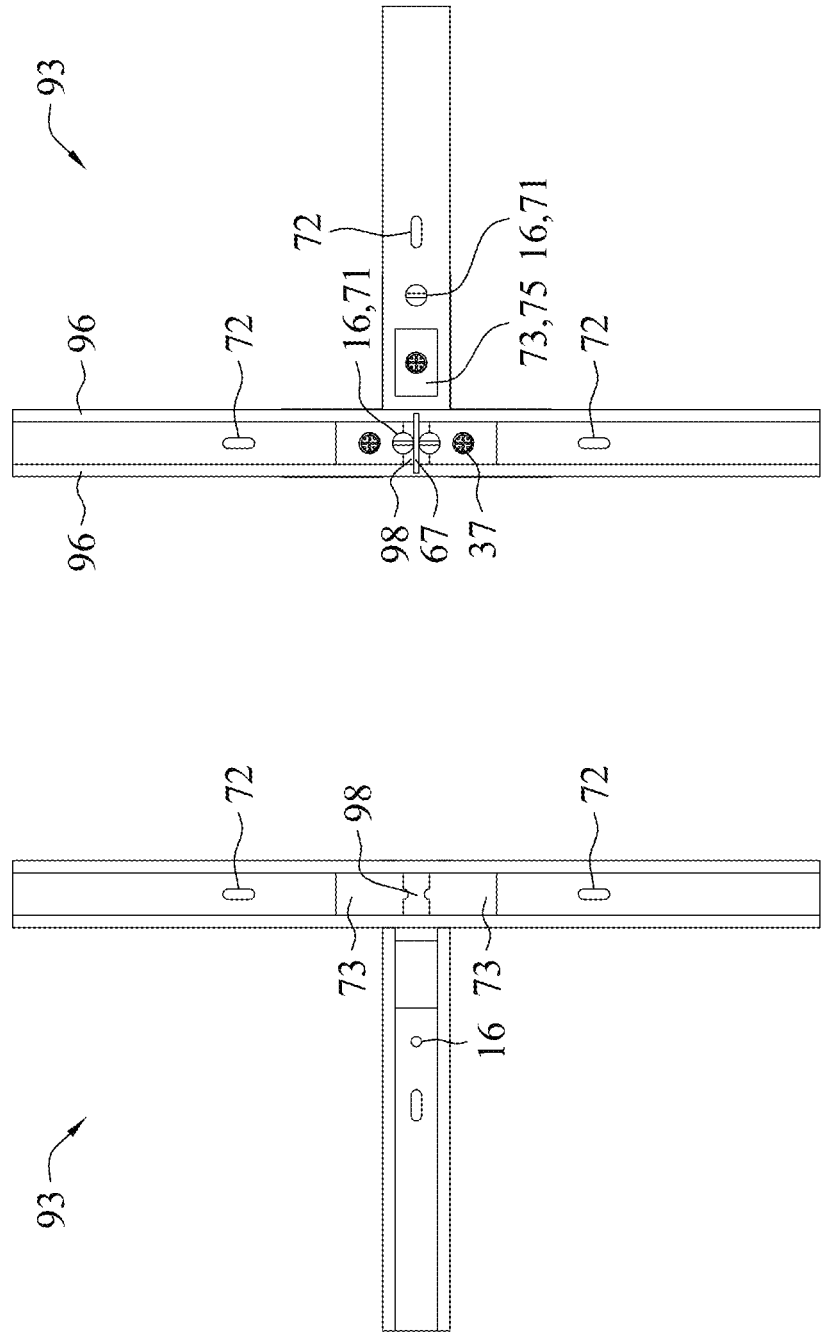

FIGS. 8A and 8B, as well as FIG. 8C and FIG. 8D show in pairs front and back views of the modular array joiner types.

Figure 9:
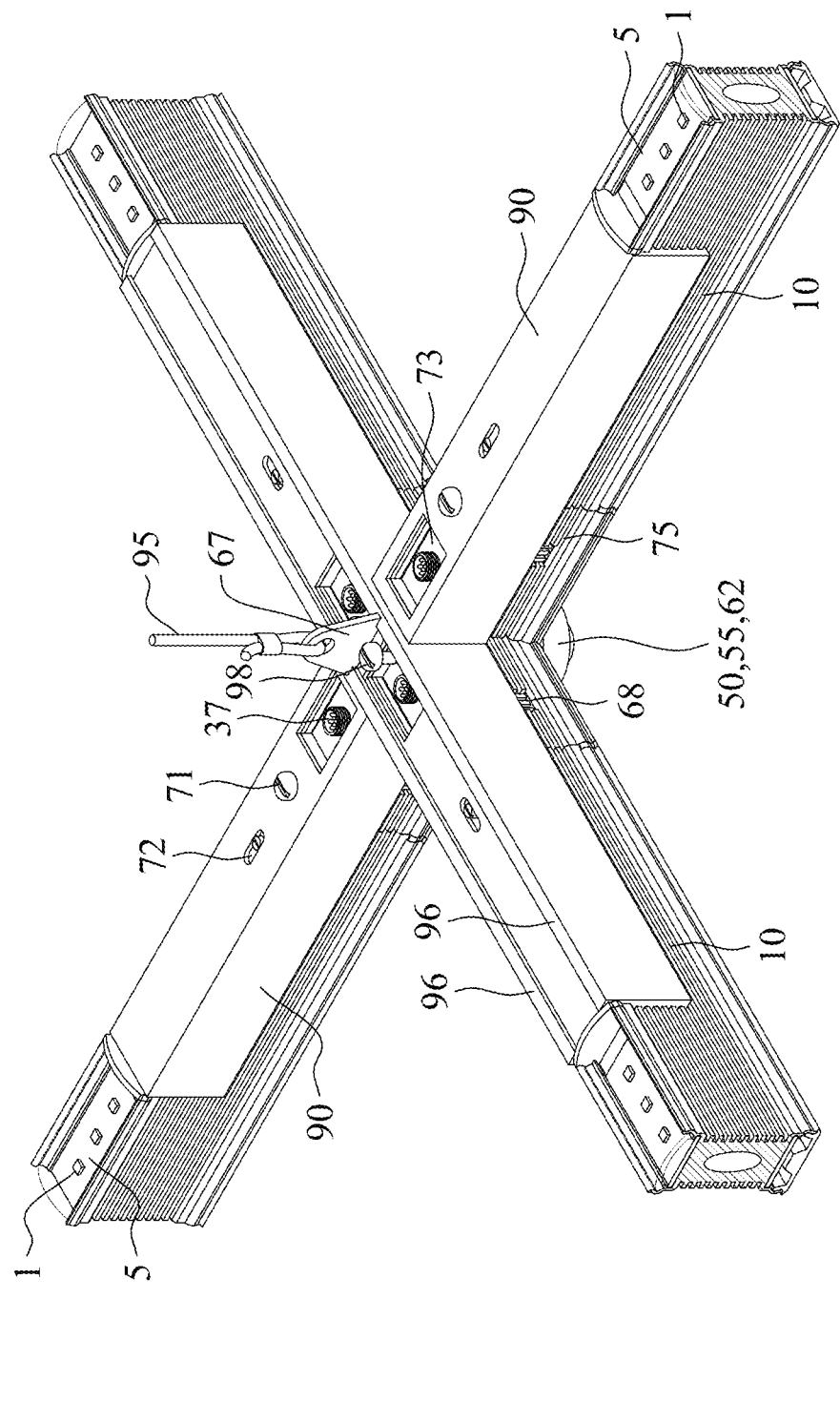

FIG. 9 shows a top perspective view of one exemplary embodiment of a cross joiner.

Figure 10:
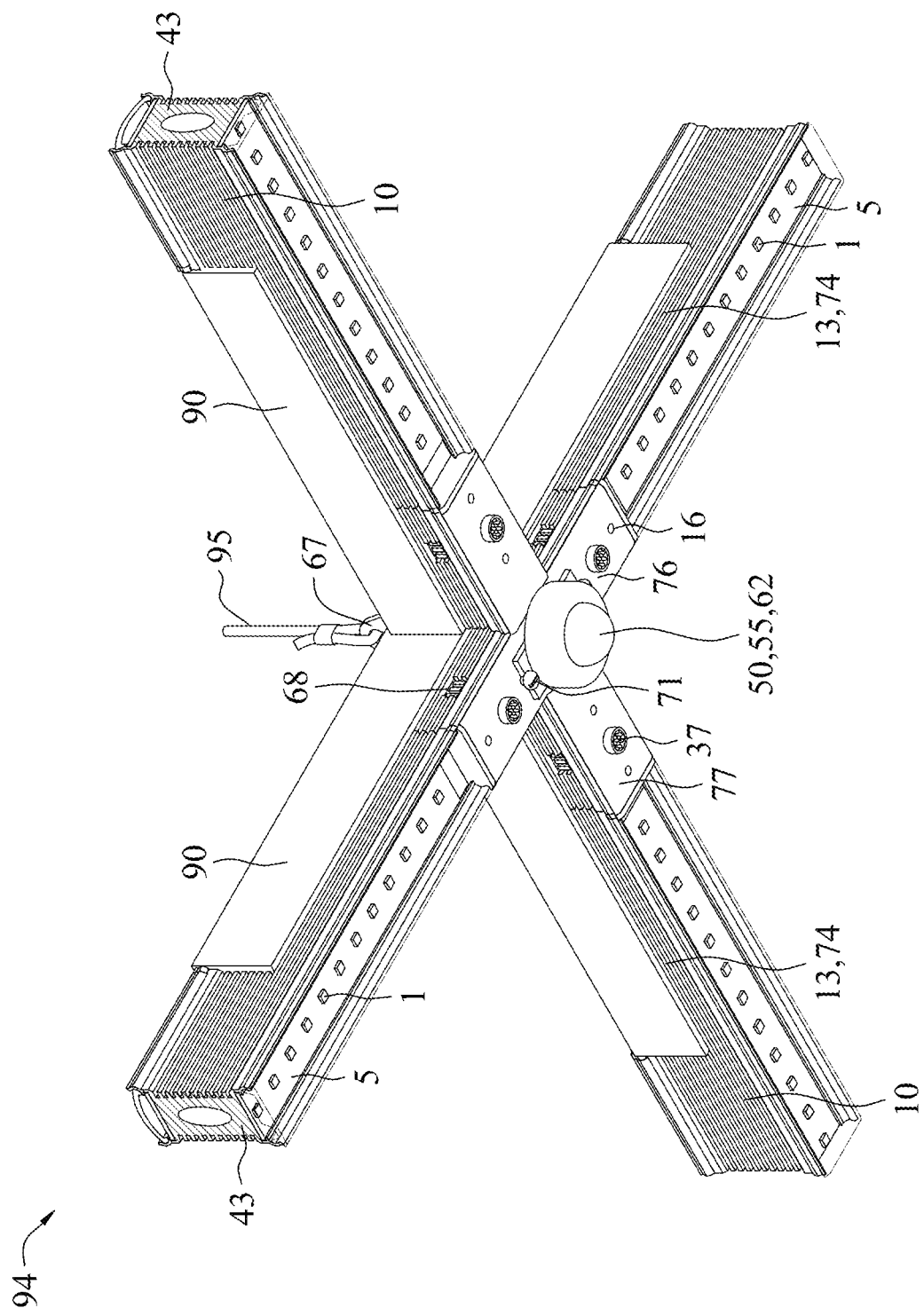

FIG. 10 shows a bottom perspective view of one exemplary embodiment of the cross joiner.

FIG. 11 shows an elevation of the heatsink module array suspended by a cable from a support harness/housing.

Figure 12B:
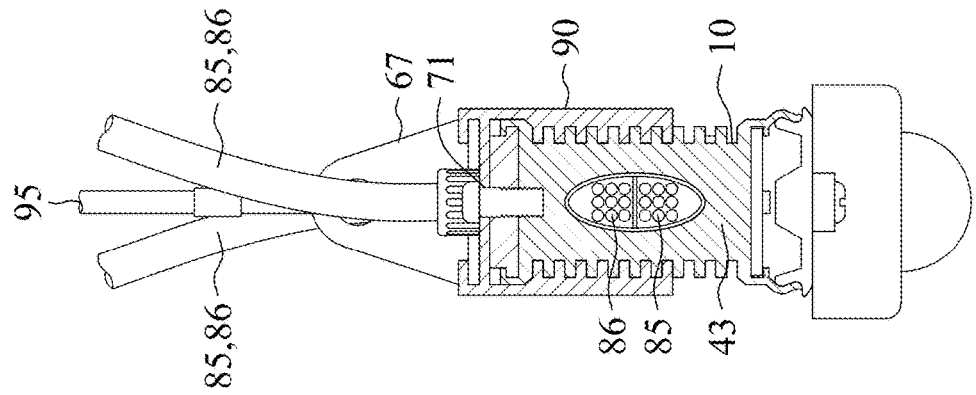
Figure 12A:
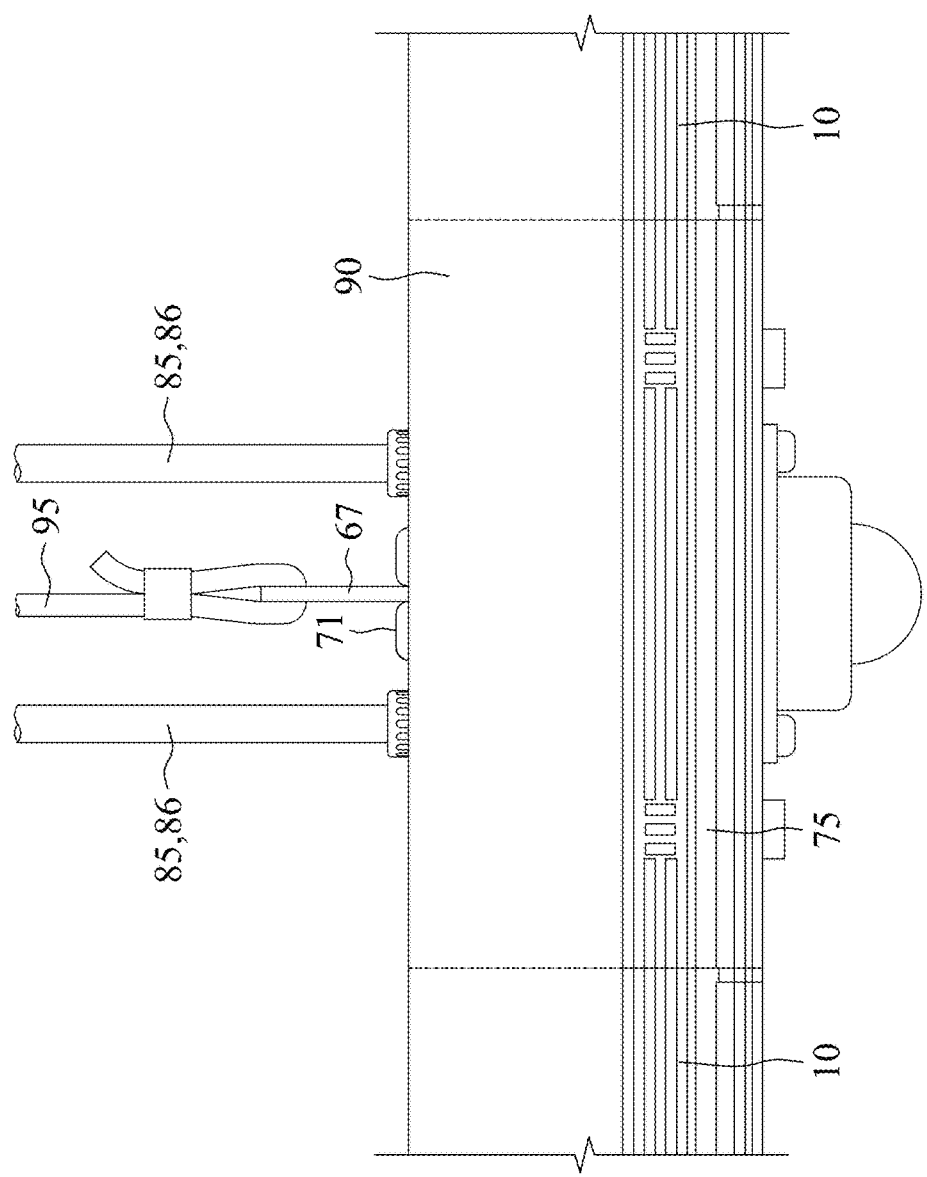

FIG. 12A shows a partial elevation of, and FIG. 12B shows a transverse section through, the joiner, with a device receptacle, respectively.

Figure 13:
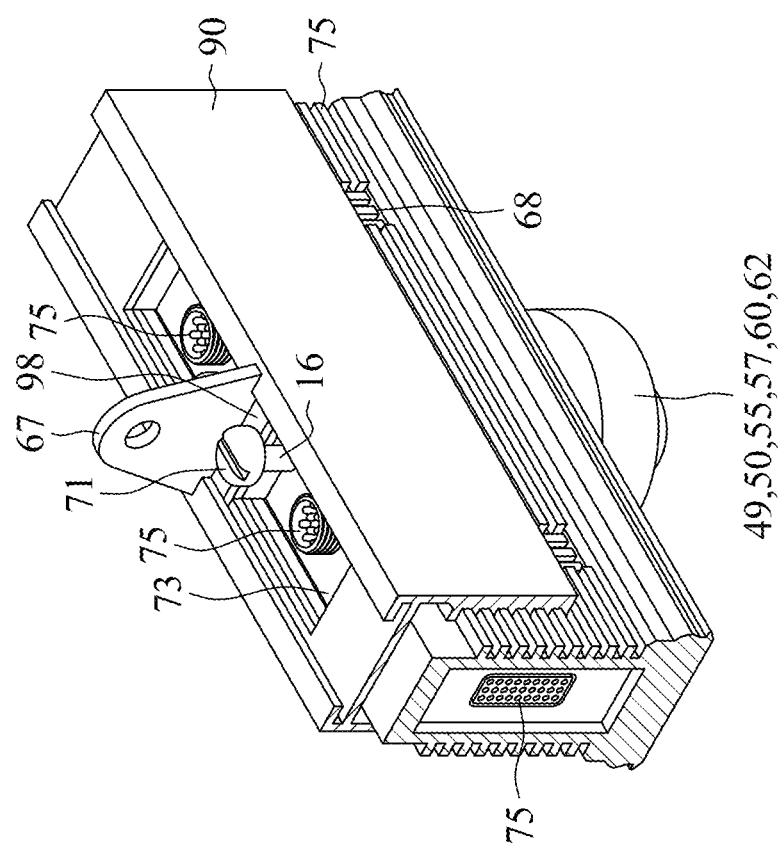

FIG. 13 shows a partial enlarged top perspective of the joiner with a coupled device receptacle.

Figure 14B:
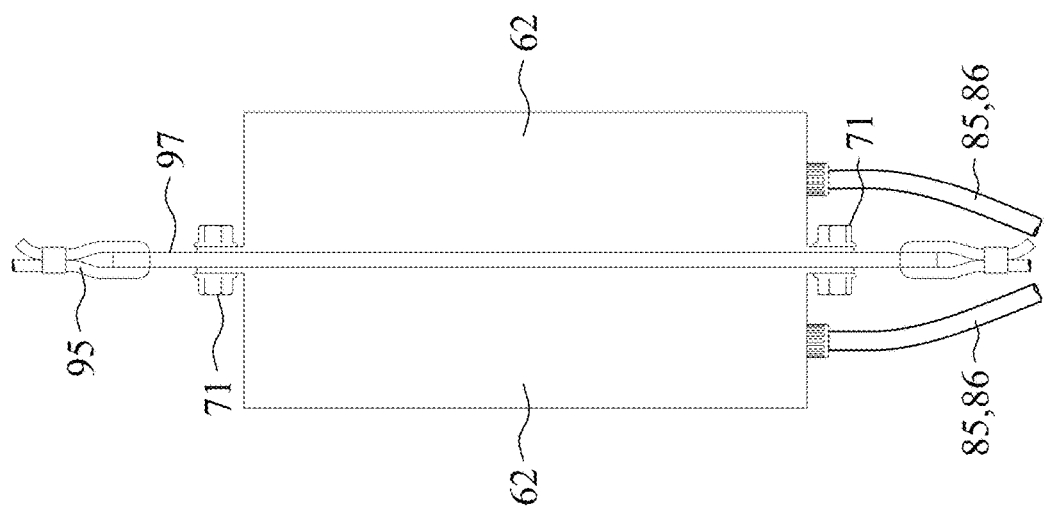
Figure 14A:
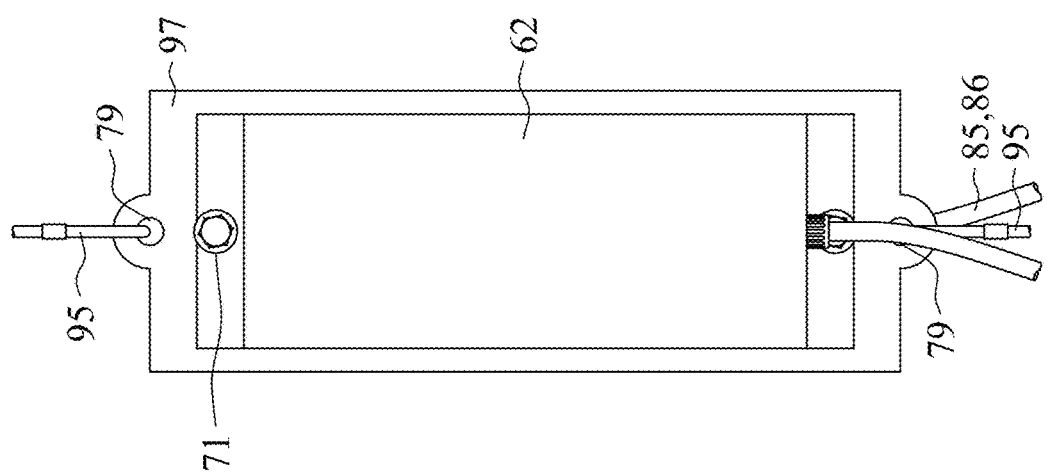

FIG. 14A and FIG. 14B respectively show front and side elevations of an electronic device support harness with coupled devices.

FIG. 15A and FIG. 15B respectively show front and side elevations of an electronic device housing.

Figure 16A:
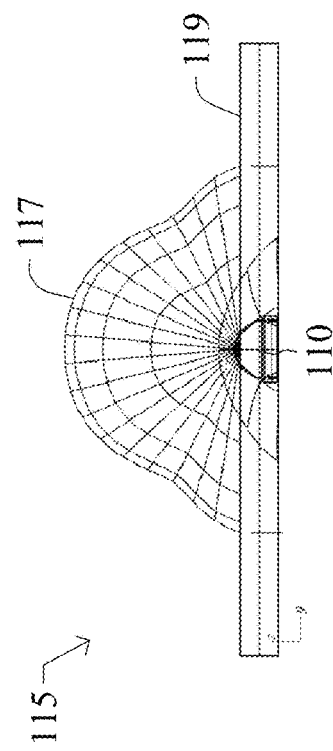
Figure 16B:
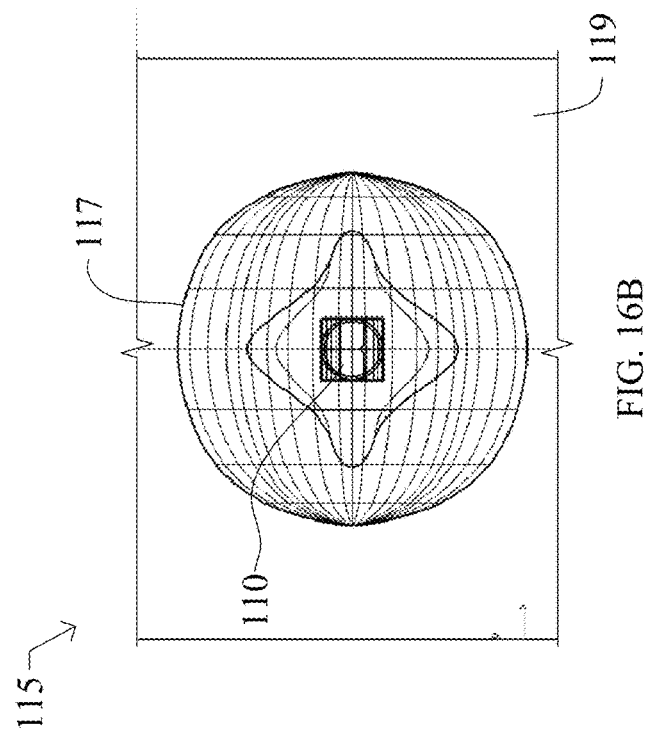
Figure 16C:
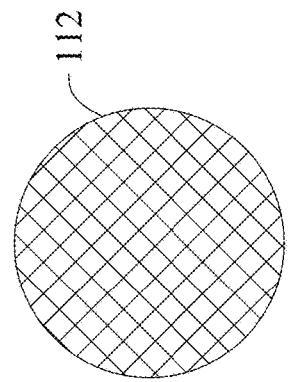
Figure 16D:
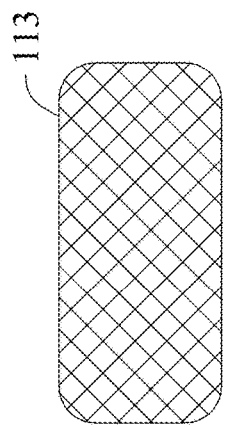
Figure 16E:
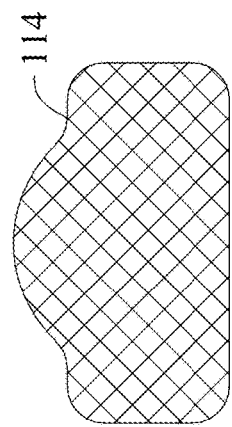

FIGS. 16A and 16B show a vertical cross section and a top view of an optical domed lens, respectively. FIGS. 16C, 16D, and 16E show three distribution patterns generated by the dome lens optics.

Figure 17B:
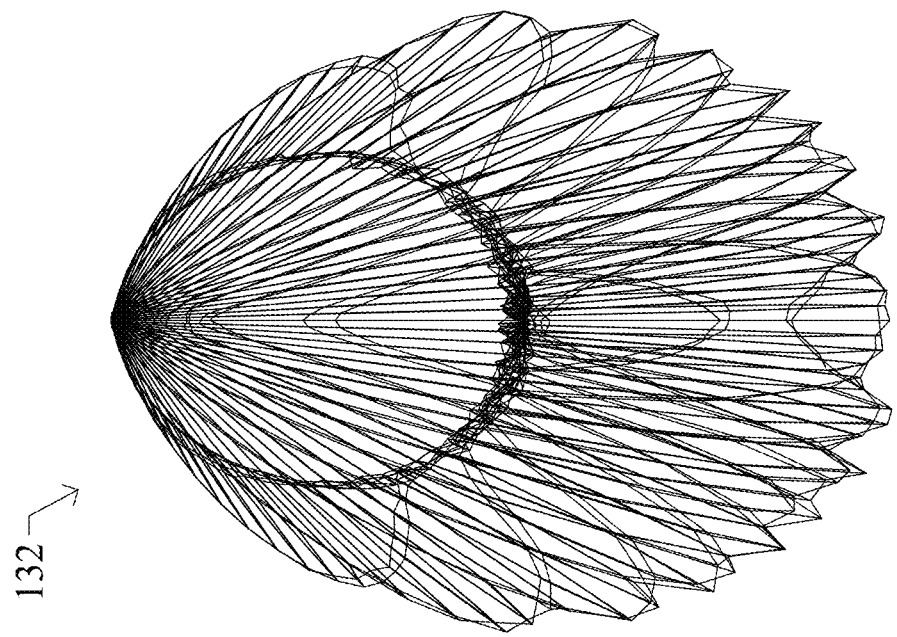
Figure 17A:
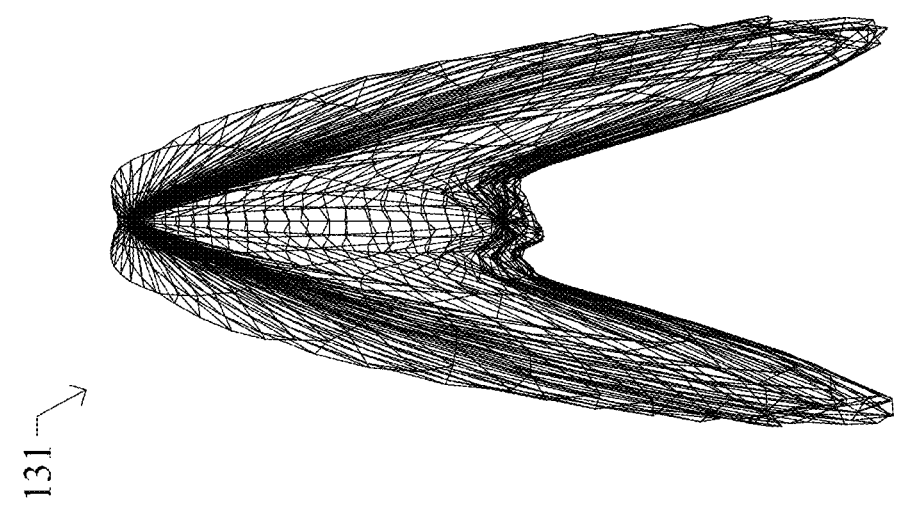

FIGS. 17A and 17B show transverse and longitudinal vertical sections of light distribution patterns generated by a racked aisle domed lens optics.

Figure 18B:
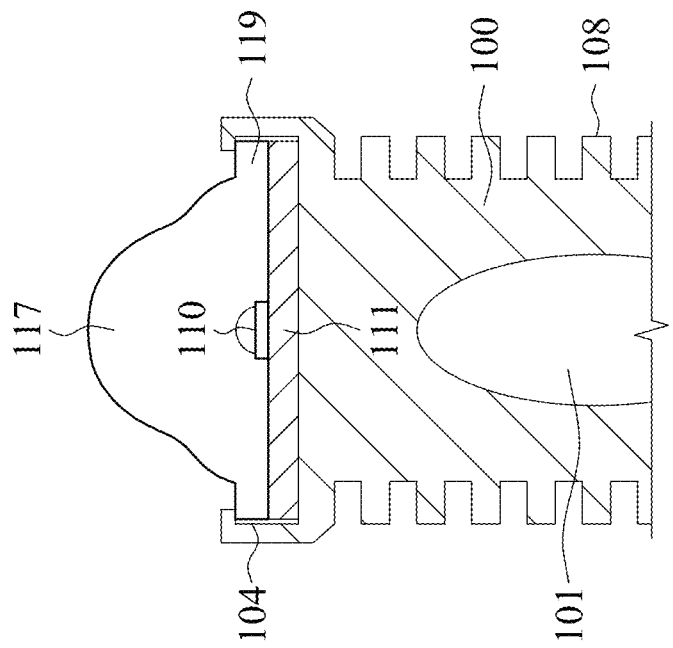
Figure 18A:
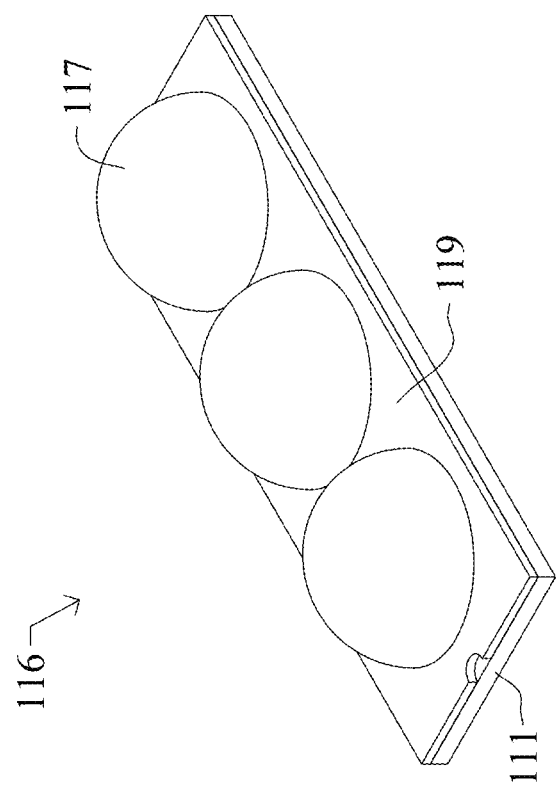

FIGS. 18A and 18B show an exemplary LED PCB with an array of lensed domed optics above the PCB and a partial enlarged section of the EMHS showing the LED PCB with the lensed domed optics above, respectively.

FIGS. 19A and 19B show top and bottom perspective views of the EMHS system, respectively.

Figure 20:
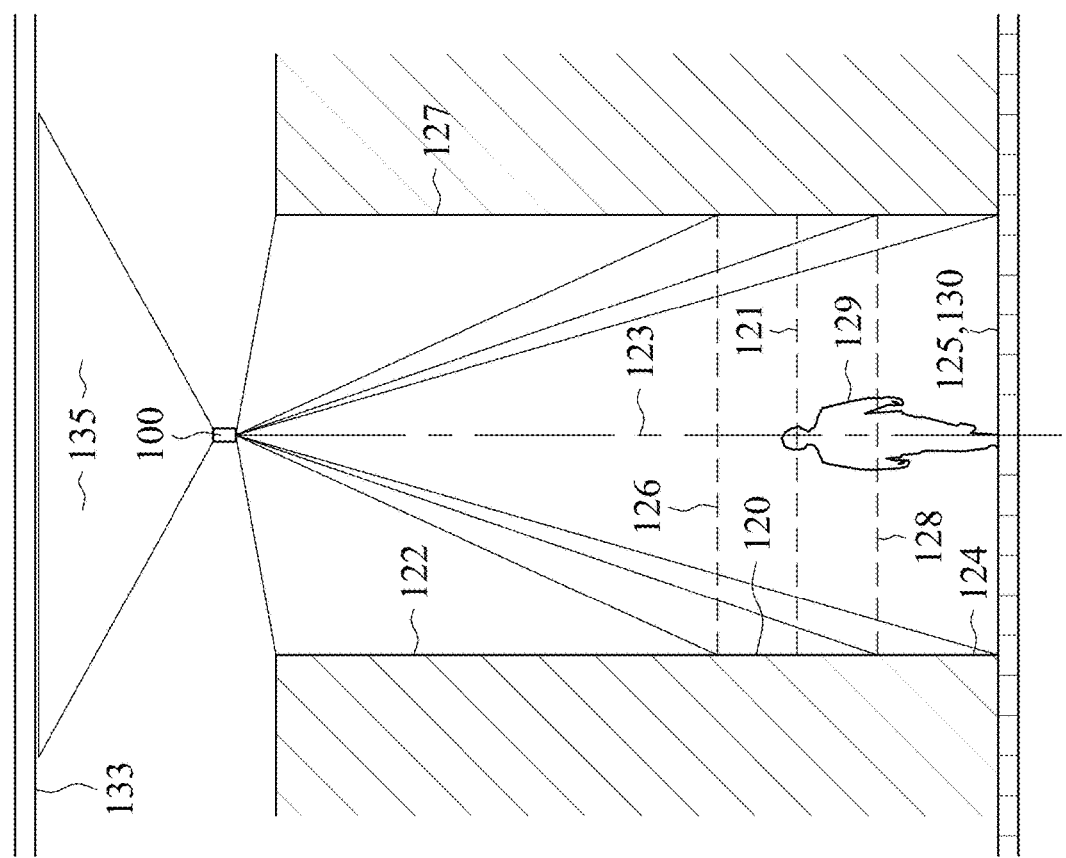

FIG. 20 shows in a diagram section format an EMHS positioned above a racked aisle inside a room, emitting light in upward and downward directions.

Figure 21:
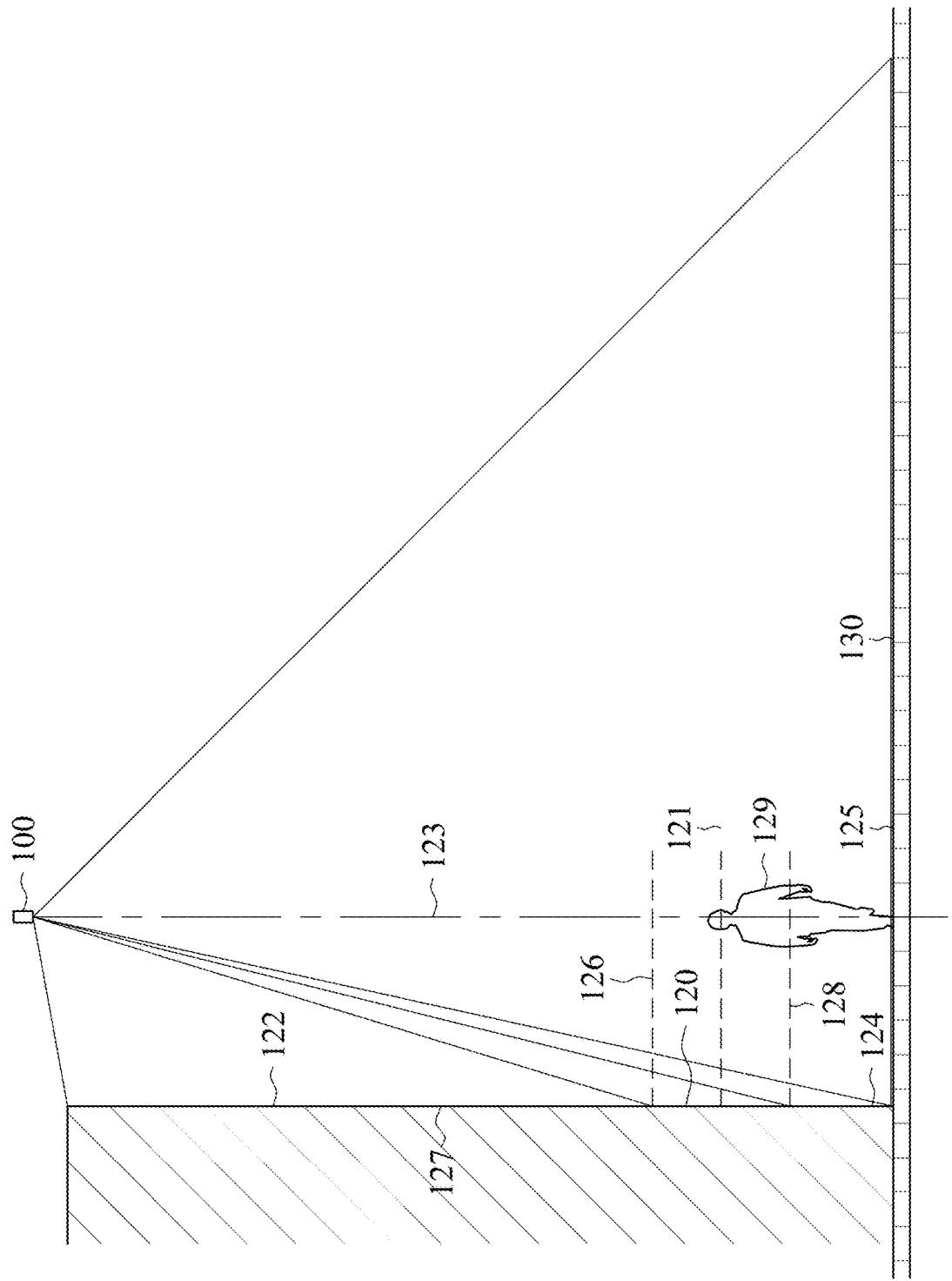

FIG. 21 shows in a diagram section format an EMHS positioned above a room with a vertical surface adjacent, emitting light downwardly.

DETAILED DESCRIPTION

By way of background and in reference to the parent patent application, the parent patent application teaches "a device further comprising an array of elongated heatsink modules, each heatsink module of the array is unitarily fabricated and displays a solid heatsink core with a longitudinal opening extending through the heatsink core from one end of the heatsink core to the other end, and includes a plurality of heat dissipating fins unitarily coupled to the heatsink core; a plurality of light sources, with a light source of a plurality of light sources respectively coupled to the exterior surface of at least one of the heatsink cores, at least one conductor that extends a length of the longitudinal opening in the core of each of the heatsinks, and a device receptacle that electromechanically couples at least two of the heatsink modules and conveys at least one of: power or data between the at least two of the heatsink modules, wherein a portion of the heat generated by the plurality of light sources is conveyed through the heatsink core of each of the heatsink modules directly to most of the plurality of the heat dissipating fins."

The parent patent application describes several means to physically couple electrical devices to the elongated heatsink array. By way of this description, the Applicant describes two types of harnesses onto which the devices are coupled. The harnesses can also serve as the joiner that couples and aligns the heatsink modules. Since the heatsink module array is configured to support a plurality of devices of different shapes and weights made by a plurality of manufacturers, the present inventor recognizes that it is difficult to anticipate the appearance and induced stresses these devices may apply on the reduced profile of the heatsink module array.

The coupled devices to the heatsink module array of the parent patent application can include at least one of, a power supply, a processor, a communication device, a sensing device, a power storage device, a signaling device, an audio device, an air quality device, and any other device that can functionally and operationally belong to the array or is unrelated to the array's operational performance.

The present disclosure resolves the limitations of physically coupling a plurality of electrical devices to the reduced profile heatsink module array. Moreover it places at least one power supply for at least one light source that is coupled to a heatsink module distally above the heatsink array.

The power supply and/or at least one other power consuming device can be coupled to a support harness and/or a housing. The support harness and/or the housing is suspended from a structure above while supporting the load of at least a portion of the heatsink module array distally located below. The support harness and/or the housing is optionally an integral part of the vertical support structure of the heatsink module array.

The present disclosure diverts power from a main circuit/s to "local" power consuming I/O (Input/Output) device/s. Conductors conveying power or power and data through the elongated heatsink module array are tapped so as to power the at least one distal and external power consuming device. The at least one external power consuming device in turn provides power or power and data to at least one local heatsink module I/O device coupled and/or a device in the vicinity of the array. The remaining portion of the circuit/s' power flows through the longitudinal bore of the elongated heatsink module array downstream tapped by a local I/O device/s as needed.

The present disclosure further enables turning a linear heatsink module array to transversely diverge while reducing the number of vertical support members. It does so by introducing several joiner shape types and by adapting a device receptacle to receive and convey power in at least four directions. The device receptacle couples to a joiner.

The joiner with the coupled device receptacle is configured to at least support and provide power to a local portion of the elongated array of heatsink modules. The device receptacle of the present disclosure is configured as a power/data distribution hub.

The device receptacle is tasked with:
Conveying power and/or data from one heatsink module to at least a second heatsink module,
Conveying power, data and/or signals (wherein the signals have a waveform that carries digital information and/or provide control signaling) to at least one external electrical device mounted distally on a vertical support member above the heatsink array,
Conveying power, data and/or signals from at least one distally mounted electrical device to another electrical device coupled to the device receptacle and/or a heatsink module,
Conveying power, data and/or signals from at least one distally mounted electrical device to another electrical device coupled to a different heatsink module in the vicinity of the array, and
Conveying power, data and/or signals from at least one distally mounted electrical device to another electrical device in the vicinity and/or at a remote location, wherein the device can be operationally related to the heatsink module array or not related.

The device receptacle can also provide additional utility by providing a mounting means of attachment to support the heatsink module's array. In the present embodiment, the mounting means of attachment to support the array of heatsink modules is a joiner. The device receptacle can be shipped to the installation site encased inside the joiner.

The device receptacle can have a plurality of power and/or data receptacle/s. The device receptacle can be configured to convey at least one of, house power, low voltage, and signals. The signal can be conveyed from at least one of, device/s coupled to an element of the heatsink module array, devices coupled to a distal support harness and/or housing, device/s coupled to neighboring arrays, and devices disposed in a remote location/s.

The joiner is tasked with aligning at least two coupled heatsink modules, wherein the device receptacle electrically couples the two heatsink modules. The heatsink module array can be linear and/or nonlinear.

The joiner, with at least one device receptacle encased inside, can support at least one of, an "I" shaped linear 180° heatsink module array configuration, an "L-shaped" heatsink module array configuration, wherein the array of modular heatsinks is at 90°, a "T-shaped" heatsink modular array configuration, wherein the "T" is at 90°, and a "cross shaped" configuration, wherein the heatsink modules of the array are at 90° to one another.

The support harness and/or housing can be suspended from the same vertical structure that supports the heatsink modular array load. By so doing, no load stresses are applied onto the array of the modular heatsinks. Further, the heat generated by power consuming devices coupled to the support harness/housing, including at least one power supply, is dissipated to the air above the heatsink modular array, thus the light sources and any other electrical I/O devices coupled to the array are not subject to the contributary heat resulting in prolonging the life and improving the performance of the coupled electrical devices.

The at least one power supply coupled to the support harness/housing can have a conductor cable extending from one end. The conductor cable at its other end can be configured to couple a receptacle of the device receptacle encased inside the heatsink module array joiner. The conductor cable extender can be detachable from at least one end. Similarly to the at least one power supply, other power consuming device/s coupled to the support harness/housing can couple respective power and/or data cables to communicate electrically with coupled I/O devices to the array and remote devices.

The support harness/housing can retain at least one of, a sensing device, a power transforming device, a communication device, a processing device, a controlling device, an output device, and a back-up power device with a corresponding charger. The back-up power device can at least maintain power to a light source coupled to the heatsink module when house power is disrupted.

The retaining structure/housing can be suspended from a structure above by an aircraft cable, a chain, a rod, a pipe, or any other means including the use of material that is metallic or non-metallic attachment material. In at least one preferred embodiment, an aircraft cable can couple the retaining structure to the array of heatsink modules. The aircraft cable can couple to at least one of, the device receptacle and the joiner.

It is noted that the at least one power supply of the present disclosure is externally and distally disposed above the array of at least one first and one second coupled modular heatsink/s. A portion of the power entering the one first heatsink module is conveyed through a device receptacle to the external and distally located power supply.

The power supply then powers at least one power consuming device coupled to at least one of, the at least one of the first and/or the second heatsink module and/or a device coupled to the device receptacle. The other portion of the power entering the first heatsink module continues flowing through a device receptacle to at least the one second coupled heatsink module.

It is further noted that at least one power supply retained by a support harness and/or disposed inside a housing can power a plurality of heatsink sections. The heatsink sections powered by the power supply can be upstream, downstream, or on both sides of the suspended from above support harness/housing with the coupled power supply. The power supply and other power consuming devices powered and/or controlled by devices coupled to the support harness/housing are referred herein as locally powered devices.

The combined benefits of separating at least one power supply from the heatsink module array by coupling it to the support harness/housing include:
Heat reduction resulting from separating the power supply from other heat generating devices that are coupled to the array,
Easy access to the power supply and/or other coupled devices, Easy replacement of detachable components without impacting the operation of the array, Eliminating any stresses on the device array due to devices of different dimensions and weight, and Enabling better design versatility by placing devices of different utility away from the modular reduced profile array.

There are several methods the contractor can choose from to hang the heatsink array. In one preferred method, the contractor can:

a. Shoot a laser or pull a line across the length of the heatsink array to be constructed.

b. String from the support structure an aircraft cable with a support harness and/or a housing that has an extension aircraft cable to a coupled joiner below. The spacing and the mounting height of the vertical support aircraft cable can be configured to maintain the same elevation with the spacing between each cable corresponding to the length of the heatsink modules as shown in the erection plan.

c. Slide the first heatsink section into a joiner until it makes positive contact with a device receptacle disposed inside the joiner. Secure the heatsink section in place by fastening an anti-disengagement mechanical fastener that securely couples the heatsink module to the joiner. The anti-disengagement device provides for the array's thermal expansion without breaking power/data connectivity.

d. Proceed to the next vertical support and repeat the process, this time also coupling the at least one power supply conductor cable extending down from the support harness/housing to a corresponding receptacle disposed at the top surface of the device receptacle.

e. Then couple an I/O device to the bottom of the device receptacle when shown on the erection plan.

f. Proceed following the same methodology to the end of the run, and then return to the starting point, adjusting the array height along the way where needed.

g. The final step is extending a starter power cable from a J-box to the first device receptacle located inside the first joiner. The first joiner can have a current limiter inside, coupled to the first device receptacle. In other embodiments, a current limiter can be coupled to the J-box, or in between the J-box and the first joiner.

Turning now to the figures, FIG. 1 illustrates nominal heat sink modules length and several examples of power and/or data conveyance configuration schemes all based on maximizing the heat sink module spacing. The configuration schemes also illustrate examples of electronic devices that may be coupled to the heat sink array.

The Array Couplers

The heat sink array is formed by coupling a plurality of heat sink modules end to end along their longitudinal axis. The present disclosure employs an electromechanical coupler to couple at least two modules of heat sinks. The coupler is comprised of two interlocking elements—the device receptacle and the heat sink joiner. The joiner comes in two types—the plate joiner or the saddle joiner.

The electromechanical coupler and the device receptacle joined together are tasked with:

mechanically coupling at least two heat sink modules, mechanically aligning at least two heat sink modules, flowing power and/or data between at least two heat sink modules, flowing power to and/or from at least one electrical device to a device receptacle, flowing data to and/or from at least one electrical device to a device coupled to the device receptacle, and supporting the weight of at least one electrical device coupled to the device receptacle.

Figure 6:
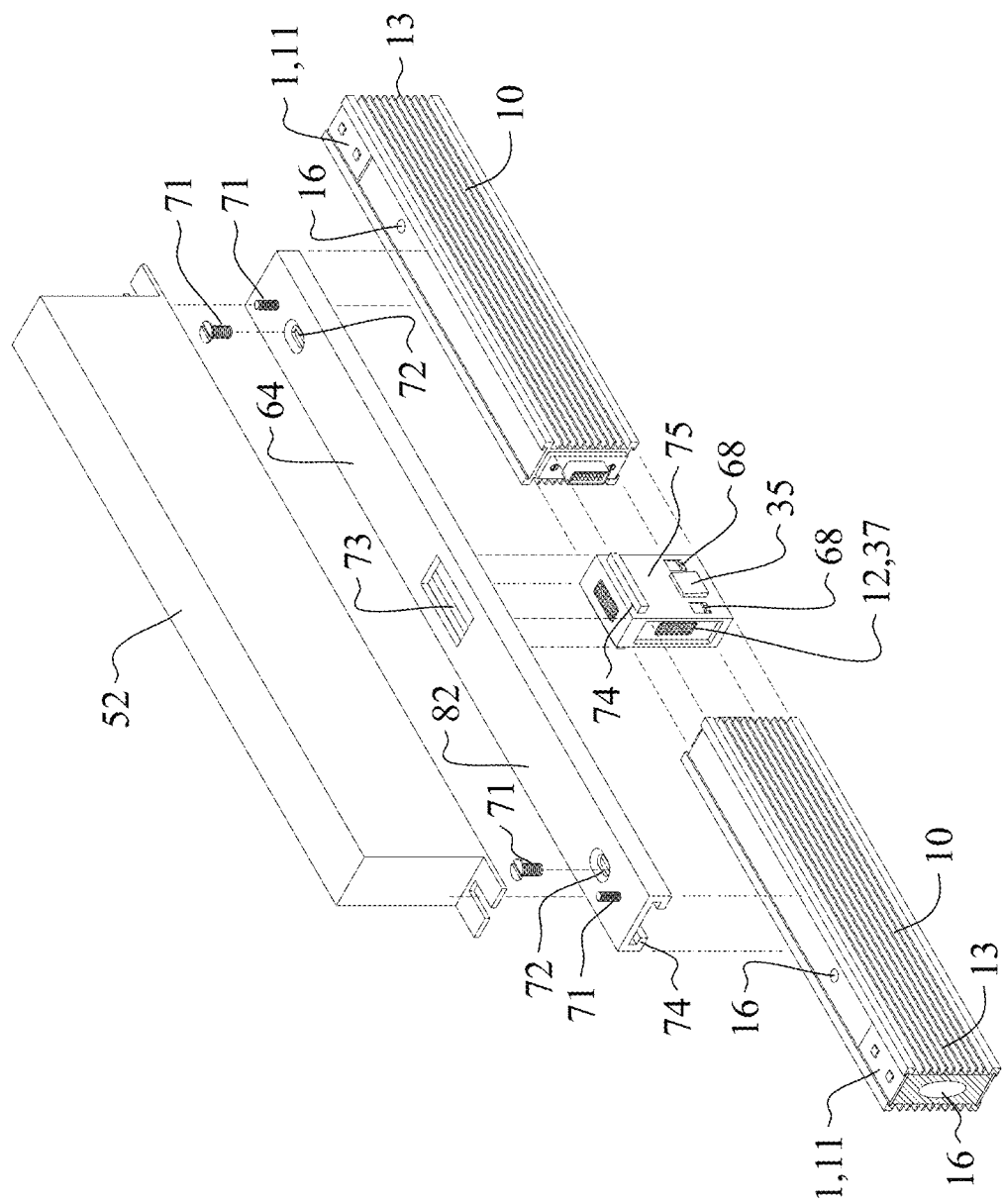
FIG. 6 illustrates an exploded perspective view from above of the heat sink array elements coupled to the plate joiner.
Figure 7:
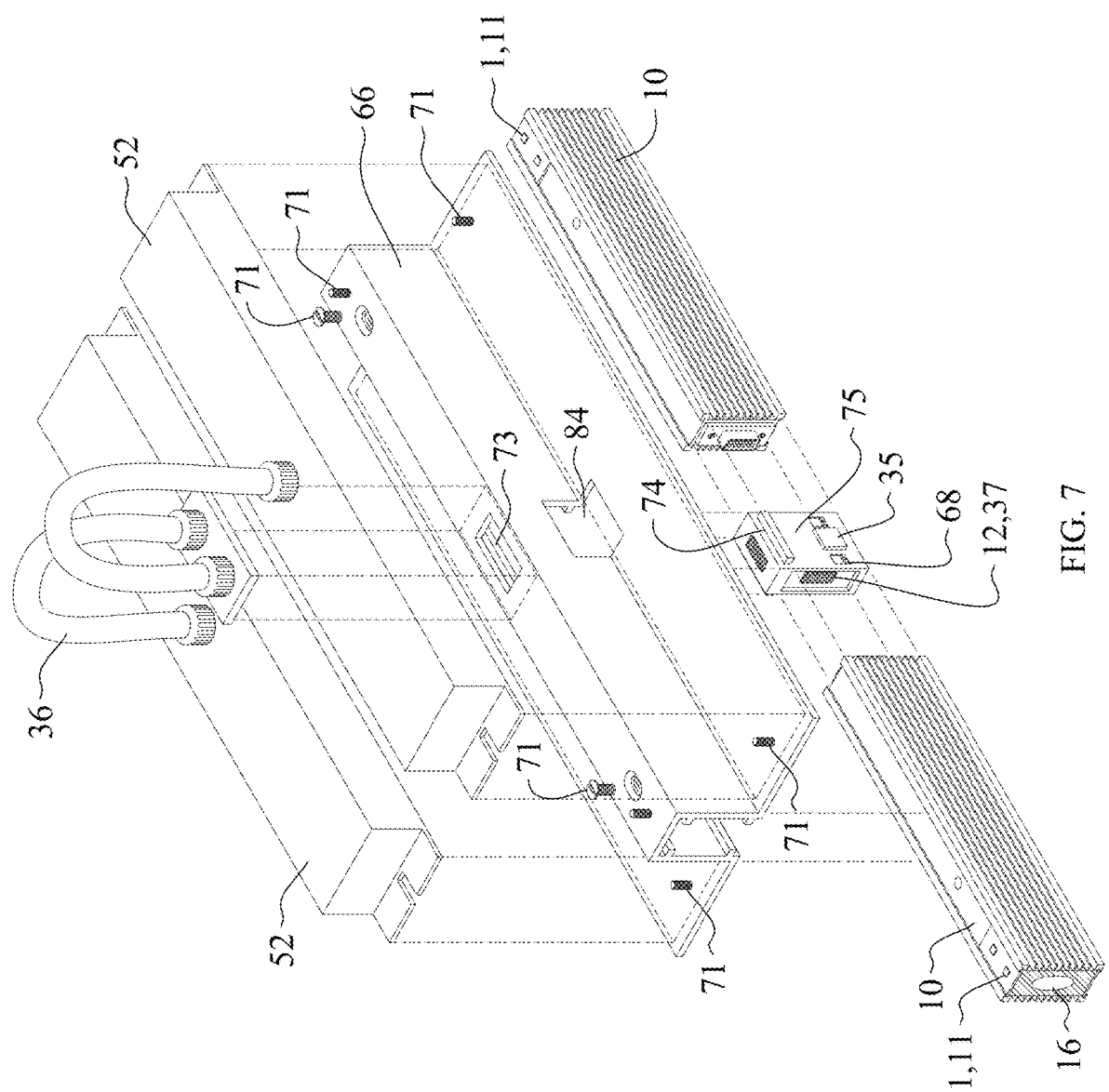
FIG. 7 illustrates an exploded perspective view from above of the heat sink array elements coupled to the saddle joiner.

FIGS. 6 and 7 illustrate exploded perspective views of the heat sink couplers. FIG. 6 illustrates the heat sink coupler plate joiner type from top view. FIG. 7 illustrates the heat sink coupler saddle joiner type from top view. The plate joiner is configured to have an electronic device coupled on its top surface and the saddle joiner is configured to be coupled to electronic devices coupled to a saddle at opposite longitudinal sides of the heat sink array.

The Coupler Devices

The joiner plate and the joiner saddle are configured to be coupled to at least one of: a power supply, a back-up power storage unit, a processor/controller with resident memory and code, and a communication device. In addition, the coupler device may be coupled to sensing and output devices. In other examples, the sensing and output devices may be coupled to the device receptacle that electrically joins the heat sink modules. The devices of the present disclosure may be detachable and may be supplied already coupled to the joiner plate or the joiner saddle.

The Receptacle Device

The receptacle device is configured to flow through power and/or data between a heat sink module(s) and a plurality of downstream heat sink modules. It is also configured to draw power and/or data to "local" power consuming devices coupled to the device receptacle and nearby coupled devices. Devices coupled in the vicinity include at least one light emitting module. Devices coupled to the device receptacle may include communication, processing/control. Input/out and sensing devices. These devices may be coupled to a universal port configured to couple to uniform device connector that is configured to receive and transmit power and/or data.

Data Processing and Communication

The array of the elongated heat sinks modules may communicatively be coupled to a remote processor and controller and/or be configured to have at least one processor and controller coupled to a device receptacle of the array. Having a local processor reduces demands on a remote processor, avoiding the problem of communication latency. The array may be divided into a plurality of sub-zones with each sub-zone equipped with sensing devices. Input sensed from each sub-zone then may be processed following programmatic parameters, built in logic and remote instruction/s. AI code residing on a local processor may govern the array operation within at least one sub-zone. Having control over sub-zones improves the zones' operational utility and ensures the safety of the sub-zones' occupants. For example, a germ and a bacterial eliminating ultraviolet (UV) light may be coupled to the elongated heat sink along with a light source tasked with ambient illumination. The UV light source is configured to operate when the ambient light source is off. A sensing device may sense the presence of a person approaching the sub-zone illuminated by the UV light sending a signal to the processor. The processor's controller then turns the UV light off and may turn the zone's ambient light on.

The sensing devices may include at least one of: a camera, an occupancy sensor, a daylight sensor, an air quality sensor, and smoke/fire sensor. Output devices may include at least one of: a light source, a sound cancellation device, an audio input/output device, back-up power storage unit and a communication device. The communication across the heat sink array may be wired and/or wireless. In addition, the array devices may in part or in whole be addressable, communicating with neighboring and remote devices. The communication between some of the devices may be direct, bypassing a local and/or remote processor.

The Processor and Code

At least one processor tasked with at least one operation of a device coupled to the heat sink array employs a code. The code may fully reside locally with a processor, or at least in part with a processor. In addition, distributed logic and limited processing capability may be embedded with several of the array devices. Further, the code may reside in the cloud in part and may interface with the array. The code may employ artificial intelligence (AI) algorithms including code that learns the operation within any of the sub-zones having the capacity to improve operational performance over time. The addressable devices coupled to the array operated by AI code may operate based on sensed and communicated inputs, programmatic parameters, and applied logic based on real time local events and specified needs.

The Heat Sink Module

The heat sink module of the present disclosure dissipates substantial amount of heat while generating very high light output having a minimal cross-sectional profile. Symmetrical and/or asymmetrical optical lenses disposed on the light source modules efficiently direct the light emitted toward designated target with minimal waste. In medium and high mounting application the present heat sink array innovation exceeds all other known art when form factor size is measured in relation to light output emitted.

In forming the heat sink array, heat sink modules couple to device receptacles. At both ends of the heat sink module endcaps provide connectivity to the device receptacle. The endcaps receive and/or convey power and/or data being electrically coupled by conductors disposed inside the heat sink module longitudinal bore. The endcaps electrically couple reciprocating receptacles disposed on the exterior face/s of the device receptacle.

The power and/or data connectivity between the heat sink module and the device receptacle power and/or power and data receptacle configure lateral movement due to thermal expansion and is design to allow such movement without breaking electrical connectivity.

Coupling the Heat Sinks

Coupling the heat sinks to form an array may include the following steps:
sliding a heat sink hanger along a reciprocating track between the heat sink's longitudinally disposed fins,
securing the heat sink to the structure above by coupling the hanger to above structure,
verifying that the heat sink mounting height above the floor is as specified,
inserting the device receptacle into the joiner, squeezing the retractable protrusions, and then lock the retractable protrusions by releasing the pressure, letting the protrusions extend into the coupler's tracks,
sliding the coupler onto reciprocating tracks between the heat sink fins, and
securing the coupler to the heat sink by inserting a mechanical fastener through a slotted bore disposed in the coupler's top surface.

The steps to insert the device receptacle into the joiner, slide the coupler onto reciprocating tracks between the heat sink fins, and secure the coupler to the heat sink by inserting a mechanical fastener through a slotted bore disposed in the coupler's top surface may be repeated, coupling another heat sink to the opposing side of the device receptacle coupled to the heat sink.

Upon completing the heat sink array installation, return and populate the linear array with the electrical devices, confirm mounting height and verify heat sink modules alignment.

Complete the installation by coupling the array to conductors of a starter junction box. The conductors may convey power and/or signal.

The heat sink coupler referred herein is an assembly comprising a device receptacle coupled to one of: a plate joiner and the saddle joiner. As such, the heat sink coupler is a two-piece keyed electromechanical coupling device that couples at least two elongated heat sink modules.

The device receptacle:
conveys power and/or data to onboard and locally (neighboring) coupled device/s,
conveys through power from an upstream heat sink module to at least one downstream heat sink module,
conveys data to and from a local array's coupled and remote coupled device/s, and
enables circuit change from the exterior.

The coupler provides:
easy access to detachable and externally coupled electronic devices,
means to align the heat sink array,
means to mechanically secure the heat sink array assembly, and
means to allow lateral thermal expansion without breaking electrical connectivity.

The plate joiner and the saddle joiner are coupled to the device receptacle and at least two heat sink modules. By joining the device receptacle to the heat sink modules, electrical connectivity is established between the two heat sinks. Both the plate joiner and the saddle joiner are coupled to electronic devices. The difference between the two joiner types is their capacity to retain different size and count of electronic devices. The plate joiner retains a top mounted device, the saddle joiner retains at least two devices disposed at opposite sides of the heat sinks. The present embodiment is scalable, may be fabricated of metallic or non-metallic material, and may in part be shipped to an installation location pre-assembled.

The heat sink of the present disclosure provides a safe and quick means to couple the heat sink and form a heat sink array having sensing, communication, processing, and output capabilities in real time. The heat sink of the present disclosure minimizes the use of material, the use of energy, and construction/maintenance costs. Being scalable, the present innovation may be configured for all mounting heights, having at least variable light output.

A sliding hanger of the present disclosure enables alignment of the heat sink mounting location with the structure above, eliminating the need to install secondary support structure. Furthermore, this innovation eliminates the need for external power conveyance, having to use at least one rigid conduit alongside the array, feeding power to various luminaires. This innovation is configured to power the coupled devices using conductors to power its devices with power and/or data flowing through a longitudinal bore in the heat sink and through the device receptacle.

Optical Aspects of the Present Disclosure

Aspects of the present disclosure teaches about lens optics that are sized and shaped to control the directionality and intensity of light emitted from a planar lamp below the lens that is coupled to the EMHS. The present disclosure can employ a plurality of lens optics over an array of linear planar lamps such as LED lamps. Each of the optical lenses can be precisely positioned over one or several LED lamps. The plurality of LED lamps can be individually coupled to a planar surface of the EMHS, or the plurality of LED lamps can be coupled to a PCB that is coupled to a planar surface of the EMHS.

The plurality of the LED lamps can form an array of LED light lamps. The array of the LED lamps with dedicated lens optics above can couple to at least one top and one bottom surface of the EMHS. In at least one array configuration of LED lamps, at least one of a top surface and a bottom surface of the EMHS section can receive in part or in whole an array of LED lamps with optical lenses above.

The lens optics can be configured to illuminate a plurality of surfaces. These surfaces can be horizontal, vertical, non-orthogonal, or a combination of at least two of the orientations described. The surfaces can be both above and below the EMHS. Within each surface, there can be a plurality of subfields of illumination with at least one subfield of illumination receiving higher light levels than an adjacent subfield of illumination.

The lens optics deliver maximum light intensity where needed, while reducing the intensity of light on surfaces that provide little or no functional or aesthetic utility. To avoid creating severe visual contrast between surfaces, the lens optics illuminate subfields (i.e., particular portions) of an illuminated surface and/or a plurality of different illuminated surfaces within established guidelines for visual comfort. These guidelines are established by the NAIES (the Illumination Engineering Society of North America) describing acceptable maximum to minimum ratios per a given environment and task.

The optical lens is optionally configured in relation to the LED lamp/s it covers. A plurality of different types of LED lamps can couple to the EMHS. It is noted that the LED lamps can differ from one another by at least one of size, luminosity, color temperature, and chromaticity. It is further noted that the use of different LED lamps can be associated with different functionalities. That said, the lens optics over each LED lamp can relate to the task the lamp's dedicated optics is configured to perform.

The lens optics can be configured to be placed over an individual LED lamp or over a plurality of LED lamps. For example, a downfacing array of LED lamps coupled to the bottom surface of the EMHS can be comprised of two lamp types with corresponding lens optics above. One lamp type lens optics can be configured to illuminate both vertical and horizontal surfaces. This lamp type with its coupled lens optics can be configured to operate during business hours. The other lamp type with its coupled lens optics can only operate at night, providing night light illumination over horizontal surfaces only.

In a different embodiment, an array of LED lamps with corresponding dedicated lenses above can couple to a top surface of the EMHS. The array of LED lamps can be comprised of two lamp types. The first lamp type with its coupled lens optics can be configured to provide ambient illumination over the ceiling above. The lens optics of the first lamp type can have a wide illumination pattern, providing uniform ambient illumination across the ceiling plane. The second lamp type can emit UV light that is configured to eradicate viruses and bacteria. Over the second light source, dedicated lenses can be configured to have a narrow beam light emission pattern, so that the UV light emitted is most intense, and is directed toward the ceiling mitigating direct exposure to humans.

It is noted that the operation of the LED lamps can be by individual lamp type or in unison with one another.

About the Lens Characteristics

In at least one embodiment, the lens above the LED light source that is coupled to a bottom surface of an EMHS can be configured to emit light in such a manner that the most intense vertical illuminance on a vertical surface below falls at and/or in the vicinity of an adult human's eye level. An adult human's eye level is defined as or in the proximity of 5'-0" AFF.

With an adult human's cone of vision at approximately 60°, the horizontal band above and below human eye level varies as the distance from a vertical surface varies for a human staring directly at the vertical surface. This band is referred to herein as the inclusionary range. The inclusionary range is a subfield of illumination that is central to the teachings herein. In retail, distribution, and manufacturing spaces with racked aisles, the racks (with items thereon) that are on either side of an aisle constitute vertical surfaces. A horizontal surface may be the aisle between the racks. In these spaces ample illumination above and below the inclusionary range, as well as on the horizontal surface of the aisle is important for human operation, such as to be able to comfortably see the aisleway, as well as other areas above and below the inclusionary range where the items (e.g., items for sale) are located at or about eye level. However, the light in the inclusionary range is greater on average that the areas above and below the inclusionary range. This light distribution has the practical effect of "profiling" the commercial products that are of interest to a human observer (e.g., the items for sale at a "big box" store), while simultaneously providing sufficient light to illuminate other vertical and horizontal portions of the racked aisles to provide the human observer with adequate light to see the floor of the aisle and other parts of the vertical racked surfaces outside of the inclusionary range. Consistent with these objectives, an average light level on an illuminated surface area above the heatsink module is less than the average light level in the inclusionary range. The illuminated surface area is an area having a predetermined surface rectangular surface area defined by a width and a height, with the width being in an inclusive range of 2 feet to 20 feet and the heigh being in an inclusive range of 2 feet to 20 feet.

For example, the lens optics of the present embodiment can be configured to intensely illuminate the inclusionary range which spans (for example) 2'-0" below, up to 2'-0" above an adult human's eye level—in other words, in this example the inclusionary range of the vertical surface spans between 3'-0" and 7'-0" above the floor. The illumination of the same contiguous vertical surface below and above the inclusionary range can be less intense because retailers who arrange items on the racks do not often place items of interest to the human observer outside of the inclusionary range. The contiguous vertical surface below the inclusionary range, while having a less intense average illuminance level than the average illuminance level of the inclusionary range, can show a greater average illuminance light level than all surfaces above the inclusionary range, including the vertical surface contiguous to the inclusionary range.

The optical lens described herein are configured to cover an LED lamp that is coupled to an EMHS and can be configured to illuminate both horizontal and vertical surfaces. The horizontal surface can be a walkway below the EMHS and the vertical surface can be a rack adjacent to the EMHS. The EMHS can be centered or can be off centered to a longitudinal axis of a walkway aisle, wherein the vertical surface's height can vary from just above the floor to as high as 50'-0" above the floor. The width of a typical aisle walkway in retail, distribution, and manufacturing spaces can vary from as little as 5'-0" to as much as 12'-0".

Given the variation in aisle width and vertical surface height, the optical design of the lens common to all conditions aims to illuminate the inclusionary range and the walkway illuminance first. The inclusionary range's top and bottom limits defined by the average adult human eye level and the viewer's distance from the vertical surface.

The lens design takes into account the distance from the light source to at least two target surfaces, also referred to herein as subfields of illumination. The two surfaces include at least one vertical surface and one horizontal surface. The lens optics can be configured to have a sharp cut-off, where a substantial portion of or all light emitted by an LED lamp with corresponding dedicated lens optics above coupled to an EMHS does not exceed 45° from nadir, as viewed along the longitudinal axis of an aisle walkway below an array of EMHS.

The aisle walkway is defined by at least one adjacent vertical surface. The lens optics can be configured to direct at least a portion of the light emitted above 45° from nadir, away from the walkway below toward at least one vertical surface.

The lens optics of the EMHS can be symmetrical and/or asymmetrical. When the EMHS is mounted adjacent to and above a walkway with a vertical surface on one side, at least one asymmetrical lens optics can couple to the bottom surface of the EMHS. The lens optics can then be configured to emit the light over a plurality of vertical subfields of illumination, including an inclusionary range along one side of the EMHS, and another portion of the light emitted by the lens optics can illuminate a portion of the walkway surface below the EMHS and the same surface extending outwardly.

The asymmetrical polar curve generated by the lens optics shown transversely cut across the EMHS shows a narrow distribution pattern for the portion of the light directed toward the vertical surfaces and a wider distribution pattern directed toward the horizontal surface below and extending away.

It is further noted that the present innovation lens optics can be configured in such a manner that the light emitted over a plurality of surfaces can display at least one of a uniformity ratio within an entire surface area, a uniformity ratio between subfields of illumination within a single surface area, a uniformity ratio between one surface of illumination and another surface of illumination, including a surface that is differently oriented, and a uniformity ratio between one surface and a plurality of subfields of illumination of a different surface. The surfaces and at least two subfields of illumination of a different surface can be above, below, and/or to at least one side of the EMHS.

Visual acuity is operationally essential in vertical display environments such as retail, distribution, and manufacturing. The operational activity can include visual inspection in a retail environment and part placement or picking in distribution and manufacturing environments. As the average human reach is less than 7'-0" above the floor and artificial light sources are mounted well above human reach, regardless of the light source mounting height the vertical surface of the inclusionary range can begin from a human's maximum reach of less than 7'-0" to a human's eye level and approximately the same distance downwardly. For visual acuity, therefore, the inclusionary range needs to be well lit.

With respect to uniformity ratios, it is self-evident that in racked space, the uniformity ratio between a horizontal surface such as a floor and a vertical surface such as the face of a rack is an important factor in establishing the operational visual comfort. Furthermore, a reduced component of apparent glare contributes to improved visual acuity in the racked space.

The present innovation's lens optics displays the following performance characteristics:

The average light level vertically measured over the inclusionary range can be greater than the average vertical light level vertically measured on the same vertical surface below and above the inclusionary range.

The average vertical light level vertically measured over an inclusionary range surface is greater than the average vertical light level vertically measured over at least one subfield of illumination on the same vertical surface above the inclusionary range.

The average vertical light level vertically measured over the surface of a subfield below the inclusionary range is greater than the average light level vertically measured over the same vertical surface of a subfield above the inclusionary range.

The light rays exiting the EMHS along the longitudinal axis of the EMHS more than 45° from nadir can in part or in whole be directed toward at least one vertical surface.

The average vertical light level on the surface of the inclusionary range measured vertically is greater than the average horizontal light level on a surface above the EMHS measured horizontally.

The average horizontal light level measured on a surface of a racked aisle adjacent to a vertical surface of a rack measured horizontally is equal to or greater than the average light level on the vertical inclusionary range of the rack measured vertically.

The light emittance pattern of a lensed optics coupled to the top surface of the EMHS that is mounted parallel to and over a racked aisle illuminating a surface above is wider than the light emittance pattern of a lensed optics coupled to the same EMHS bottom surface directing light downwardly toward a horizontal surface and at least one vertical surface.

The light emittance distribution pattern of the lensed optics coupled to the surface of the EMHS that directs light downwardly is configured in relation to at least one of the eye level of an adult human and the proximity of an adult human to adjacent vertical surface/s.

The light rays exiting the EMHS along the longitudinal axis of the EMHS more than 45° from nadir can be directed in part or in whole toward at least one vertical surface.

At least two different light distribution types of optical lenses can be placed above at least one surface of the EMHS.

The lamps coupled to the EMHS covered by at least one optical lens are controlled in unison and/or individually.

The glare component of the light emitted by the optical lens of the EMHS that is mounted over and parallel to a racked aisle can be configured not to exceed 16 uniform glare ratio as viewed at the eye level of an adult human observer traversing a racked aisle.

At least one LED lamp coupled to a surface of the EMHS and covered by an optical lens can emit more than 51% of the light in the UV spectrum range.

At least one optical domed lens placed over a lamp that is coupled to a surface of the EMHS is configured to precisely align with the central vertical axis of the coupled lamp.

An array of optical lenses can be fabricated with a lens base that is configured to be retained in at least one channel/slot in the body of the EMHS.

A single domed optical lens can be configured to emit at least two different light distribution patterns on a horizontal surface below the EMHS.

A single domed optical lens coupled to an EMHS can be configured to direct light from one side of the EMHS toward vertical and horizontal surfaces and from the other side of the EMHS toward a horizontal surface only.

The EMHS system coupled to the novel lens optics delivers light as specified precisely where needed. The lens is also configured to significantly reduce the apparent glare within the space, thus improving an occupant's visual acuity and comfort. The lens' light intensity control over each and all surfaces delivers best uniformity ratios, thus improving an occupant's visual acuity and comfort.

Finally, directing light to surfaces where needed at the proper distribution ratio and intensity reduces energy consumption. The energy consumption can be further reduced by introducing a means of lighting control. When placed above an EMHS' lamp, the present lamp optics outperforms other linear light emitting luminaires, especially when placed over a racked aisle.

Turning now to the figures, FIG. 1A illustrates typical length of heat sink modules and FIGS. 1B, 1C, 1D, 1E, 1F, and 1G illustrate conceptual circuitry diagrams of several power distribution configurations of the heat sink array. The typical length of heat sink modules conductor 85,86 conveying power and/or data throughout the heat sink array may be shielded. In so doing, local power and through line power may be conveyed through the elongated bore 16 of the heat sink module 10 and through the device receptacle 75 disposed between the heat sink modules 10.

FIG. 1A illustrates typical nominal length of the heat sink modules. The six elongated heat sink modules 10 illustrated below begin with a two-foot section and may grow by increments of two feet, to twelve feet long sections. These heat sink modules 10 may be configured to form an array by coupling same length modules or modules of different length. Regardless of the module length, conductors 85,86 extending inside the module through bore 16 are the same and so are the heat sink 10 receptacles 37 disposed at the end of the heat sink's elongated ends that couple to the conductors 85,86.

FIG. 1B illustrates a through power and/or data conductor 85 (in solid line) entering a device receptacle 75, exiting on the other side, continuing to the next device receptacle 75 where the power and/or data conductor/s 85 split/s wherein at least one conductor rises through the device receptacle 75 to a power supply 52 unit and/or another electronic device 62, while the other conductor continues through to the next device receptacle 75, exiting on the other side of the device receptacle 75 and continuing repeating the same or similar pattern downstream. The device receptacle 75 illustrated coupled to the power supply 52 is illustrated also coupled to a camera 55 from below.

Line power arriving at a power supply 52 is transformed into voltage power needed to energize at least one electronic device 62 coupled to the device receptacle 75 and/or local heat sink modules. In FIG. 1B, the device is a light source 1 is longitudinally disposed along the heat sink module 10 with the power line is illustrated in dashed line 86. FIG. 1B illustrates two heat sink modules 10 with the power supply 52 disposed in the middle and the camera 55 below having through power conductor 85 extending from end to end and local power conductor 86 extending in opposite direction of the power supply 52 providing power and/or data to the two coupled heat sink modules 10.

FIG. 1C illustrates the same power conveyance for the through line power as FIG. 1B. Power for the local device/s extends from the upstream power supply 52 to both heat sink modules 10. Other elements illustrated include device receptacles 75 and occupancy sensors 49 coupled from below to two of the three illustrated.

FIG. 1D illustrates a similar power conveyance configuration as FIG. 1B with the local conductor 86 originating with the power supply 52 extending through the device receptacle 75 to an additional coupled elongated heat sink 10 through a device receptacle 75. This configuration may employ the saddle joiner 66 having two power supplies 52, each supplying power in opposite direction to two heat sink modules 10. In this configuration, using 12'-0' heat sink modules 10, the local power conveyed may power the 48'-0" linear feet of electronic device/s 62. Elements illustrated include audio device 60, the camera 55, wireless communication device 57 and an occupancy sensor 49.

FIG. 1E illustrates a wiring configuration similar to that of FIG. 1C where the local power 86 originating with the power supply 52 is conveyed downstream through four heat sink modules 10 and three device receptacles 75. Elements illustrated include audio device 60, the camera 55, a processor 51, a wireless communication device 57 and an occupancy sensor 49.

FIG. 1F illustrates a similar configuration to FIG. 1D. FIG. 1F employs a saddle joiner 66 having at least two power supplies 52 powering input/output devices coupled to the elongated heat sink 10 and the device receptacles 75. One power supply may power downstream devices and the other upstream devices. Elements illustrated in FIG. 1F include audio device 60, the camera 55, a processor 51, a wireless communication device 57 and an occupancy sensor 49.

FIG. 1G illustrates a similar configuration to that of FIG. 1E. The configuration of FIG. 1G, like the configuration of FIG. 1E, may employ a saddle joiner 66. In this configuration, the upstream and downstream power delivered by the at least two power supplies 52 may extend up to 36'-0" in each direction resulting in power supply 52 device spacing of 72'-0" on center. The power supply 52 may have at least two circuits and so may the device receptacles 75. The device receptacles 75 may have dip switches 68 to control the circuits and direct the power to selected electronic devices 62 coupled to the heat sink 10 and the device receptacle/s 75. Elements illustrated in FIG. 1G include audio device 60, the camera 55, a processor 51, a wireless communication device 57, an occupancy sensor 49 and other sensing device 65.

FIGS. 2A and 2B illustrate perspective views of the plate joiner. FIG. 2A illustrates the top view of the plate joiner 64. The plate is an inverted elongated "U" shaped bar with two legs extending downward having at least one continuous mechanical protrusion 74 in each leg inner wall. The mechanical protrusion 74 slides along continuous tracks disposed in the elongated heat sink 10 exterior surfaces (not shown). The plate joiner 64 has a keyed opening 73 at the center of the top surface 82. The device receptacle 75 coupled from below, fills in the void in the keyed joiner opening 73. The top perimeter enclosure of the device receptacle 75 is mechanically keyed to engage the keyed joiner opening 73.

At both ends of the plate joiner 64 slotted bores 72 are configured to receive mechanical fasteners 71 coupling the plate joiner 64 to heat sink modules 10. The fasteners 71 inside the slotted bore 72 allow lateral heat sink 10 movement due to thermal expansion. The lateral movement is to occur without breaking electrical connectivity. Next to the slotted bores 72, protruded mechanical fastener 71 are configured to secure an electronic device 62 to the plate joiner 64.

The electronic device 62 is mechanically coupled to the plate joiner 64 and secured to the mechanical fasters 71. The plate joiner 64 mechanically and electrically is coupled to the device receptacle 75. The plate joiner 64 is also mechanically coupled and secured by fasteners 71 to heat sink modules 10 having tracks in the heat sinks 10 exterior surfaces. The tracks are mechanically engaged by the plate joiner 64 mechanical protrusion 74. As the assembly elements couple, power and/or data flows from one heat sink module 10 through the device receptacle 75 to at least one of: heat sink module 10 and an electronic device 62 coupled to a device receptacle 75.

FIG. 2B illustrates the bottom view of the plate joiner 64. The elongated "U" shaped bar illustrates at the center of its elongated body a keyed joiner opening 73. This keyed opening receives the top perimeter of the device receptacle 75. Unitary coupled legs extend upwardly from the sides of the plate joiner 64. Mechanical protrusion 74, unitary coupled to the legs, extend inwardly purposed to partially or fully embrace at least one of: the device receptacle 75 and a heat sink module 10. The mechanical protrusion 74 slides under a continuous track disposed along the elongated heat sink 10 exterior surfaces (not shown).

The mechanical protrusion 74 also mechanically engages the device receptacle 75. The device receptacle 75 is inserted in from below by applying pressure on at least one latch 35 disposed on the device receptacle 75 body. The pressure retracts the device's mechanical protrusion 74. The pressure on the latch 35 is released when the top of the device receptacle 75 is in position inside the keyed joiner opening 73. At both ends of the plate joiner 64 at least one slotted bore 72 is configured to allow lateral heat sink 10 movement due to thermal expansion. The movement due to thermal expansion is to occur without breaking electrical connectivity.

Figures 3A, 3B:
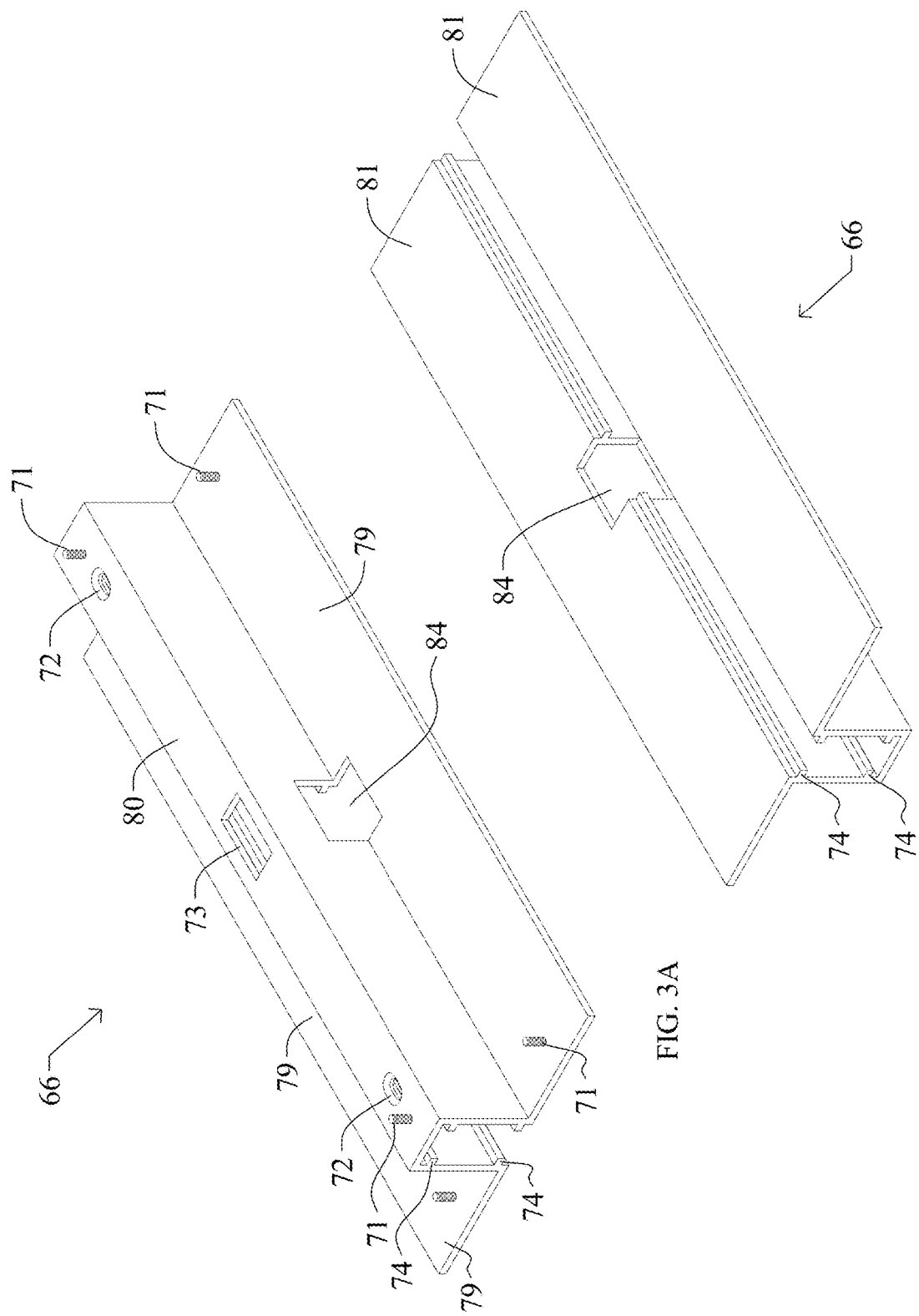
FIGS. 3A and 3B illustrate perspective views of the saddle joiner.

FIGS. 3A and 3B illustrate perspective views of the saddle joiner. FIG. 3A illustrates the top view of the saddle joiner 66. The saddle joiner 66 is an elongated bar with two vertical legs extending downward coupling to two horizontal device mounting surfaces 79. At least one of: a device receptacle 75 and heat sink module 10 embodiments are partially or fully disposed inside the saddle joiner 66 vertical legs. At least one continuous mechanical protrusion 74 is unitarily coupled in each of the saddle joiner 66 inner leg walls.

The mechanical protrusion 74 slides on a continuous track disposed in the elongated heat sink module 10 exterior surfaces (not shown). The saddle joiner 66 has a keyed opening 73 at the center of the top surface 80. The device receptacle 75, coupled from below, fills the keyed joiner opening 73 void. The top perimeter enclosure of the device receptacle 75 is mechanically keyed to engage the keyed saddle joiner opening 73.

At both ends of the saddle joiner 66 slotted bores 72 are configured to receive mechanical fasteners 71 coupling the saddle joiner 66 to heat sink modules 10. The fasteners 71 inside the slotted bore 72 allow lateral heat sink module 10 movement due to thermal expansion. The lateral movement is to occur without breaking electrical connectivity. Next to the slotted bores 72, optional protruded mechanical fasteners 71 are configured to secure an electronic device 62 to the saddle joiner 66. On both sides of the saddle joiner 66 two horizontal device mounting surfaces 79 extend outward from the saddle joiner 66 vertical legs. These horizontal plates 79 are configured to retain a plurality of electronic devices 62 including at least one power supply 52. The electronic device/s 62 are coupled to the device mounting surfaces 79 by mechanical fasteners 71 that may be disposed at the top of the mounting surface 79 opposing ends.

At least one electronic device 62 is mechanically coupled to the saddle joiner 66 device mounting surface/s 79, 81 and secured to saddle joiner 66 by mechanical fasters 71. The saddle joiner 66 mechanically and electrically is coupled to the device receptacle 75. The saddle joiner 66 is also mechanically coupled and secured by fasteners 71 to heat sink modules 10 having tracks in the heat sinks 10. The tracks mechanically engaged the saddle joiner 66 mechanical protrusion 74. As the assembly elements couple, power and/or data flows from one heat sink module 10 through the device receptacle 75 to at least one of: heat sink module 10 and an electronic device 62 coupled to a device receptacle 75.

FIG. 3B illustrates the bottom view of the saddle joiner 66. The saddle joiner 66 is an elongated bar with two vertical legs extending downward coupling to two horizontal device mounting surfaces 79. At least one of: a device receptacle 75 and a heat sink module 10 are partially or fully disposed inside the saddle joiner 66 vertical legs. At least one continuous mechanical protrusion 74 is unitarily coupled in each of the saddle joiner 66 inner leg walls.

The mechanical protrusion 74 slides on a continuous track disposed on the elongated heat sink 10 exterior surfaces (not shown). The saddle joiner 66 has a keyed opening at the center of the top surface 80. The device receptacle 75 coupled from below, fills the keyed joiner opening 73 void (not shown). The top perimeter enclosure of the device receptacle 75 is mechanically keyed to engage the keyed saddle joiner opening 73. On both sides of the saddle joiner 66 the bottom surface of two horizontal device mounting surfaces 79 are illustrated extending outward from the saddle joiner 66 vertical legs.

The bottom face of the device mounting surfaces 81 may also be configured to retain a plurality of electronic devices 62 including at least one power supply 52. The electronic device/s 62 may be coupled to mounting surfaces 81 below and 79 above by mechanical fasteners 71 that may be disposed at the top and/or bottom surface/s of the electronic device mounting surface/s 79,81 opposing sides of heat sink modules 10. In addition, optional mechanical fasteners 71, are configured to secure at least one electrical device to the saddle joiner 66 at the top surface 80 of the saddle joiner 66 next to the slotted bores 72.

At least one electronic device 62 is mechanically coupled to the saddle joiner 66 device mounting surface/s 79, 81 and secured to saddle joiner 66 by mechanical fasters 71. The saddle joiner 66 mechanically and electrically is coupled to the device receptacle 75. The saddle joiner 66 is also mechanically coupled and secured by fasteners 71 to heat sink modules 10 having tracks in the heat sinks 10. The tracks mechanically engaged the saddle joiner 66 mechanical protrusion 74. As the assembly elements couple, power and/or data flows from one heat sink module 10 through the device receptacle 75 to at least one of: heat sink module 10 and an electronic device 62 coupled to a device receptacle 75.

Figure 4:
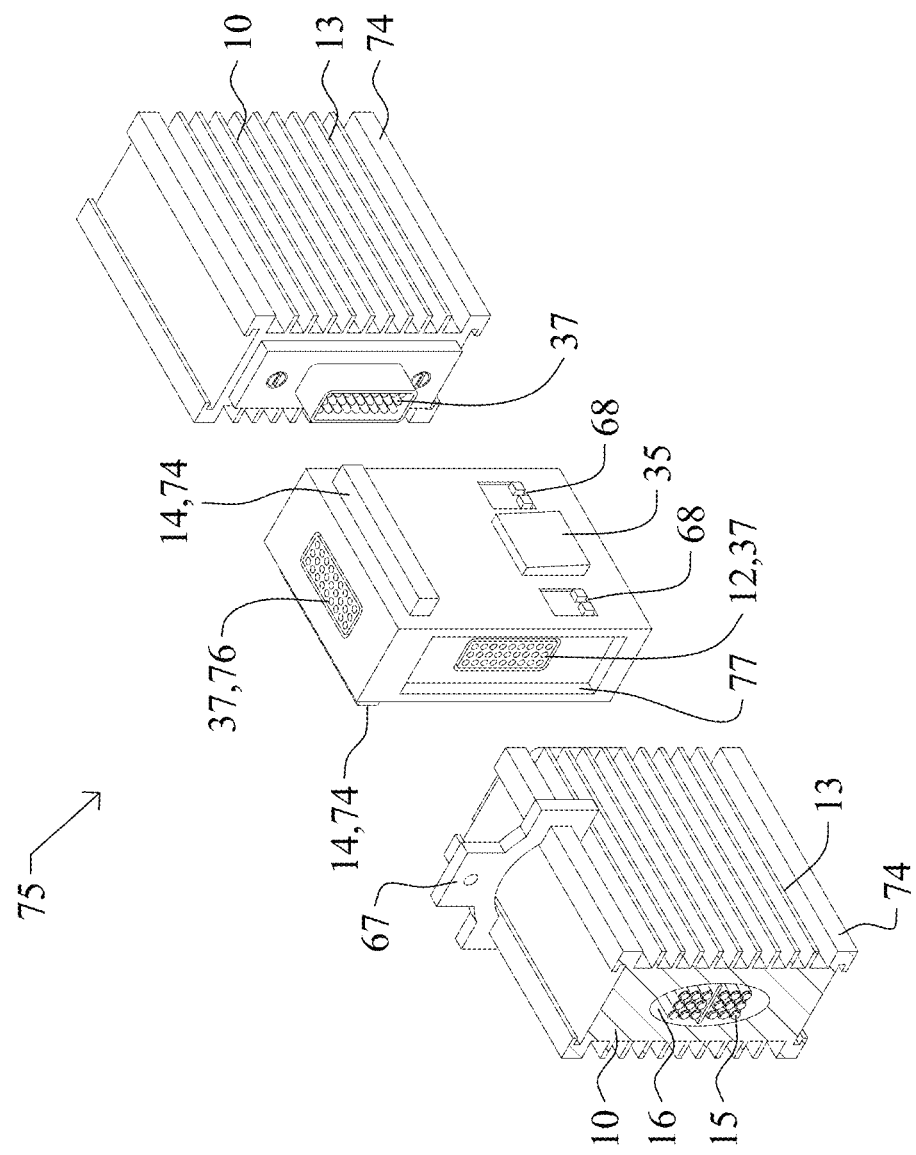
FIG. 4 illustrates a perspective view of the device receptacle.

FIG. 4 illustrates a perspective view of the device receptacle 75 with partial views of heat sink modules 10 longitudinally disposed at opposite sides of the device receptacle 75. The device receptacle 75 is an electrical element of the heat sink 10 array. Its functionalities include at least one of: power and/or data connectivity to and from coupled electronic device/s 62 and power and/or data connectivity between a heat sink 10 and at least one neighboring heat sink 10 coupled to the same device receptacle 75. In so doing, the device receptacle 75 provides continuous through power or power and data across the heat sink 10 array. The device receptacle 75 is a mechanical element that forms the heat sink 10 array. The device receptacle couples mechanically to the plate 64 and the saddle 66 joiners which in turn couple to the heat sink modules 10. The assembly is hung by the heat sink hangers 67. The electronic device/s 62 are coupled to the saddle joiner 66 and together the assembly forms the heat sink 10 array.

The device receptacle 75 is configured to receive power from an upstream source, distributing the power to a downstream heat sink module/s 10. The power received and/or distributed through the device receptacle 75 is at least one of: line power and low voltage power. The power and/or data conductor 61 may have different gage and protected by shielding. In addition, the device receptacle 75 may have at least one top and/or bottom power or power and data receptacle/s 37, 76. The receptacle/s 37, 76 are configured to couple to at least one electrical device 62. The electrical device 62 may include a power I/O and management device 52, a communication device 57, a processing/controlling device 51, and a sensing device 65.

For example, line power conveyed from the device receptacle 75 to a coupled power I/O and power management device 52 is converted to specific voltage and conveyed back through the device receptacle 75 to at least one light source 1 disposed on a coupled heat sink 10. In addition, same or other power device/s 52 coupled to the device receptacle 75 may convey processed power to the device coupled receptacle 37, 76 and/or to neighboring device receptacle/s 37, 76.

The electronic devices 62 may also draw power through the receptacles 37, 76 directly from the through line voltage power of the heat sink 10 array device receptacles 75. A dip switch 69 feature controlling a plurality of circuits may be configured to operate the device receptacle 75 electrical and/or data circuits. The present figure illustrates the dip switches 69 disposed on both sides of the release button/latch 35. Data may flow internally through wires disposed inside the heat sink 10 through bores 16 and the device receptacle 75. In addition, the data may be received and/or communicated wirelessly by at least one device 62 coupled to the device receptacle 75.

In another example, at least one circuit can be switched by relaying an instruction through at least one communication device.

Both the power and data receptacles 37, 76 of the device receptacle 75 are configured to permit lateral movement between the device receptacle 75 and the coupled heat sink modules 10 to allow thermal expansion without breaking the electrical connectivity.

The device receptacle 75 is coupled to the plate 64 or the saddle 66 joiner. At both sides and toward the top of the device receptacle 75 retractable mechanical keyed protrusions 14, 74 couple the device receptacle 75 to the joiner 64, 66. The protrusion 14, 74 is a linear bar configured to engage a track or a flat surface inside the inner walls of the joiner 64, 66. The protrusion 14, 74 may be retracted by applying pressure on the release button/latch 35 from both sides. To couple the device receptacle 75 to a joiner 64, 66, one has to apply pressure on the release button/latch 35 and then from below insert the device receptacle 75 top surface into the joiner's keyed joiner opening 73 and then release the pressure. Once the pressure is released, the device receptacle 75 is locked in position. The present latching configuration illustrated is an example of several possible configurations to couple the device receptacle 75 to a joiner 64, 66.

FIGS. 5A and 5B illustrate transverse section views across the plate joiner and the saddle joiner respectively both coupled to a heat sink. FIG. 5A illustrates a transverse section through the plate joiner 64 coupled to a heat sink module 10. The section cuts across a slotted bore 72 in the heat sink module 10. A mechanical fastening device 71 inserted from above into a slotted bore 72 of the plate joiner 64 top surface 80 secures the plate joiner 64 to the heat sink 10. The purpose of the slotted bore 72 is to allow thermal expansion of the continuous heat sink 10 array without disrupting the through power or power and data connectivity. In this embodiment, the elongated joiner 64 is shaped as an inverted letter "U" having two unitarily formed protrusions 74 extending from the plate joiner 64 legs inwardly. The protrusions 74 slide inside and along at least two tracks disposed between the top surface of the heat sink 10 and heat dissipating fins 13 below. The joiner plate 64 couples and aligns heat sink modules 10. In so doing, power and/or data conveyed through the heat sink module 10 endcap receptacle 12 flows through the device receptacle 75 and conveyed to at least one other heat sink module 10.

At least one electronic device 62 is mechanically fastened to the top surface 80 of the plate joiner 64. The device may have a power or power and data receptacle that electrically couples the electronic device 62 to the device receptacle 75 that is also coupled to the plate joiner 64. A heat sink module 10 coupled to the plate joiner 64 in this figure illustrates power or power and data conductors 15 inside a longitudinal bore 16 in the heat sink 10 and a light source module 11 coupled to the bottom of the heat sink 10.

The plate joiner 64 joins at least two heat sink modules 10 by coupling them to a device receptacle 75 disposed between. Through mechanical coupling of the two heat sink modules 10 to the device receptacle 75, power or power and data connectivity between the two heat sink modules 10 is established.

FIG. 5B illustrates a transverse section view through the saddle joiner 66 coupled to a heat sink module 10. The section cuts across a slotted bore 72 in the heat sink module 10. A mechanical fastening device 71 inserted from above into a slotted bore 72 of the saddle joiner 66 top surface 80 secures the saddle joiner 66 to the heat sink 10. The purpose of the slotted bore 72 is to allow thermal expansion of the continuous heat sink module 10 array without disrupting the through power and/or data connectivity. In this embodiment, the elongated joiner 66 is shaped as an inverted letter "U" having two horizontal surfaces extending outward from the vertical legs of the inverted "U" shaped embodiment. At least one continuous unitary fabricated protrusion 74 is/are coupled to the inner face of each of the saddle joiner 66 legs. The protrusion/s mechanically 74 engage/s tracks formed between unitary formed heat dissipating fins 13 disposed between the top and bottom surfaces of a heat sink module 10. The protrusions 74 slide inside and along at least two tracks providing precise alignment between two linear heat sink modules 10 coupled to the device receptacle 75.

At least one electronic device 62 is mechanically fastened to the saddle device mounting surface 79 of the saddle joiner 66. The device 62 power or power and data connector couples to the device receptacle 75. In this figure, the heat sink module 10 is coupled to the saddle joiner 66 illustrates power or power and data conductors 15 inside a longitudinal bore 16 disposed in the heat sink 10 core 43 and a light source module 11 coupled to the bottom of the heat sink 10.

The saddle joiner 66 joins at least two heat sink modules 10 by coupling them to a device receptacle 75. Power or power and data connectivity between the two heat sink modules 10 is established through mechanical coupling of the two heat sink modules 10 to the device receptacle 75.

FIG. 6 illustrates an exploded perspective from above of a module of the heat sink 10 array employing the plate joiner 64. From above to below the elements illustrated include an electrical device 52, a plate joiner 64, a device receptacle 75 and partial views of two heat sink modules 10 disposed at opposite ends of the device receptacle 75.

The device receptacle 75 is coupled to the plate joiner 64 from below. In this figure, coupling the device receptacle 75 to the plate joiner 64 entails applying pressure on the release button/latch 35 to retract the protrusions 74, illustrated at proximity to the top of the device receptacle, placing the top end of the device receptacle 75 inside the keyed joiner opening 73 and releasing the button letting the protrusion 74 mechanically engage the tracks inside the plate joiner 64. Once engaged, heat sink modules 10 are laterally inserted sliding into and along the mechanical protrusions 74 of the plate joiner 64. The heat sink modules 10 slide along the tracks until their endcaps 12 couple to the device receptacle 75. Then, a mechanical fastener 71 inserted from above through a slotted bores 72 of the plate joiner 64 secures the plate joiner 64 to the heat sink modules 10.

The process may be repeated, as needed, to form the heat sink 10 array adding electronic devices 52 to the device receptacle 75 bottom and top surface receptacle 37,76. A dip switch 68 bank disposed next to the button/latch 35 of the device receptacle 75 enables controlling the power and/or data circuits entering and existing the device receptacle 75. The array is hung from above by hangers 67 (see FIG. 4). The hangers 67 may travel laterally along the heat sink's 10 longitudinal lengths engaged inside tracks formed between the heat dissipating fins 13 of the heat sink 10. Mobility of the hanger 67 reduces the need to erect a support structure. In particular, the hanger 67 may be vertically aligned with a structural member above and may be coupled to a structure by an aircraft cable, chain, or pendant.

FIG. 7 illustrates an exploded perspective view of an array of heat sink modules 10 coupled to the saddle joiner 66. The elements illustrated include electrical devices 52, electrical flexible conduits 36, a saddle joiner 66, a device receptacle 75 and partial views of two heat sink modules 10 disposed at opposite ends of the device receptacle 75.

The device receptacle 75 is coupled to the saddle joiner 66 from below. In FIG. 7, coupling the device receptacle 75 to the plate joiner 66 entails applying pressure on the release button/latch 35 to retract the protrusions 74, illustrated at proximity to the top of the device receptacle, placing the top end of the device receptacle 75 inside the keyed joiner opening 73 and releasing the button letting the protrusion 74 mechanically engage the tracks inside the plate joiner 64. Once engaged, heat sink modules 10 are laterally inserted sliding into and along mechanical protrusions 74 extending inwardly from both legs of the saddle joiner 66. The heat sink modules 10 slide along the track until their endcaps 12 couples the device receptacle 75. A mechanical fastener 71 inserted from above through a slotted bores 72 of the saddle joiner 66 secures the saddle joiner 66 to the heat sink modules 10.

The process may be repeated, as needed, to form the heat sink 10 array adding electronic devices 52, to the device receptacle 75 on its bottom and top surfaces. A dip switch 68 bank disposed on the side of the device receptacle 75 enables controlling the power and/or data circuits entering and existing the device receptacle 75. The array is hung from above by hangers 67 (see FIG. 4). The hangers 67 may travel laterally along the heat sink's 10 longitudinal lengths engaged inside tracks formed between the heat dissipating fins 13 of the heat sink 10. The hanger's 67 mobility reduces the need to erect a support structure, the hanger 67 may be vertically aligned with a structural member above and be coupled to structure by an aircraft cable and/or a chain.

FIGS. 8A, 8A, 8C and 8d show in pairs front and back views of the modular array joiner 90 types. The types include joiners 91, 92, 93 and 94. On the right side, the top view is shown and on the left side, the bottom view is shown.

FIG. 8A shows a top view of an "I" shaped joiner 91 with a device receptacle 75 encased inside the top view only. The device receptacle 75 is configured to couple two heatsink modules 10 (not shown in this figure) at both ends, to form a linear array 100 (not shown in this figure) arrangement. The elements shown on the top surface of the "I" shaped joiner 91 include a hanger 67, a hanger track 96, a hanger bridge 98, a power/data receptacle 37, a keyed joiner opening 73, a heatsink anti-disengagement slotted bore 72, and a fastener 71 over a device receptacle coupling bore 16.

The bottom view is of an "I" shaped joiner 91 shown without a device receptacle 75 encased inside. The elements shown include, a keyed joiner opening 73, a hanger bridge 98, and heatsink anti-disengagement slotted bore/s 72. A fastener 71 inserted from above the hanger bridge 98 through the slotted bore 72:
  a. Secures the hanger 67 from lateral movement, and
  b. Secures the joiner to the device receptacle 75.

The keyed joiner openings 73 shown at the opposite sides of the hanger bridge 98 provide connection points for power and/or data connectivity between the above suspended support harness/housing 97, 99 and the device receptacle 75 encased inside the joiner 91. The same purpose applies to the "L", "T", and "Cross" joiners 92, 93, and 94.

The first "I" joiner 91 of an array 100 as well as the "L", "T", and "Cross" joiners 92, 93 and 94 can include a current limiter (also described as a current limiting circuit, not shown, which includes a current sensor, a control circuit, and a pass transistor). The current limiter can be coupled to the device receptacle 75 at the power entry side. At the end of an array 100, a plug-in device 12 (not shown) can be placed inside all the joiner types including the "T" joiner 91. The plug-in device can be placed at the opposite side of the power entry to the device receptacle 75. The plug-in device 12 can prevent exposing the power and/or data connectors of the device receptacle.

FIG. 8B shows a top view of an "L" shaped joiner 92 with two device receptacles 75 encased inside. The device receptacles 75 are configured to couple two heatsink modules 10 (not shown) at both ends at 90° to one another. The elements shown on the top surface of the "L" shaped joiner 92 include, a hanger 67, a hanger track 96, a hanger bridge 98, a power/data receptacle 37, a keyed joiner opening 73, a heatsink anti-disengagement slotted bore 72, and a fastener 71 over a device receptacle coupling bore/s 16.

The bottom view of the "L" shaped joiner 92 is shown without the full-size and the reduced size device receptacles 75 encased inside. The elements shown at the bottom side of the joiner include, and a heatsink anti-disengagement slotted bore/s 72, a hanger bridge 98, a keyed joiner opening 73, and a fastener coupling bore 16.

Bottom views of all joiners 91, 92, 93 and 94 show an anti-disengagement slotted bore 72. The slotted bore prevents a coupled heatsink module 10 (not shown) from disengaging electrically and/or mechanically from the device receptacle 75 and the joiner 92 respectively. A fastener 71 (not shown) coupled from above through the joiner 72 to the heatsink module 10, allows for limited lateral mobility of the heatsink module 10. The lateral mobility travel range is configured to maintain electrical connectivity while allowing for thermal expansion of the heatsink modules 10 of the array 100 (not shown).

The first joiner 92 of an array 100 can include a current limiter (not shown). The current limiter can be coupled to the device receptacle 75 at the power entry side. At the end of an array 100, a plug-in device 12 (not shown) can be placed inside the joiner 92 at the opposite side of the power entry to the device receptacle 75. The plug-in device 12 can prevent exposing the power and/or data connectors of the device receptacle.

FIG. 8C shows a top view of a "T" shaped joiner 93 with two device receptacles 75 encased inside. The device receptacles are configured to couple three heatsink modules 10 (not shown), two at the opposite ends of a device receptacle and one perpendicularly to the orientation of the coupled two. The elements shown on the top surface of the "T" shaped joiner include, a hanger track 96, a power/data receptacle 37, a keyed joiner opening 73, a heatsink anti-disengagement slotted bore 72, and device receptacle coupling bore/s 16.

The "T" shaped joiner 93 elements shown at the bottom side of the joiner include, a hanger bridge 98, a keyed joiner opening 73, a bore 16, and heatsink anti-disengagement slotted bore/s 72.

The first joiner 93 of an array 100 can include a current limiter (not shown). The current limiter can be coupled to the device receptacle 75 at the power entry side. At the end of an array 100, a plug-in device 12 (not shown) can be placed inside the joiner 93 at the opposite side of the power entry to the device receptacle 75 (not shown). The plug-in device 12 can prevent exposing the power and/or data connectors of the device receptacle 75.

FIG. 8D shows a top view of a "Cross" shaped joiner 94 configured to extend a linear array 100 (not shown) of heatsink modules 10 (not shown) in two directions that are perpendicularly oriented to one another.

The top view of joiner 94 shows a portion of a device receptacle 75 encased inside the joiner 94. Joiner 94 has three device receptacles 75. The device receptacles 75 are configured to couple as many as four heatsink modules 10, two at the opposite ends of a device receptacle and two perpendicularly to the orientation of the former coupled two. The elements shown on the "Cross" shaped joiner top surface include, a hanger 67, a hanger track 96, a power/data receptacle 37, a hanger bridge 98, a fastener 71, a keyed joiner opening 73, heatsink anti-disengagement slotted bore/s 72, and device receptacle coupling bore/s 16.

The bottom view of the "Cross" shaped joiner 94 elements shown at the bottom side of the joiner include, a keyed joiner opening 73, a hanger bridge 98, a bore 16, and heatsink anti-disengagement slotted bore/s 72.

The first joiner 94 of an array 100 can include a current limiter (not shown). The current limiter can be coupled to the device receptacle 75 at the power entry side. At the end of an array 100, a plug-in device 12 (not shown) can be placed inside the joiner 90 at the opposite side of the power entry to the device receptacle 75. The plug-in device 12 can prevent exposing the power and/or data connectors of the device receptacle.

The joiner types shown in FIGS. 8a, 8b, 8c, and 8d can be made of metallic material, non-metallic material, or a combination thereof. The joiner can be painted and can contain flame-retardant material. At least one element including the device receptacle 75 retained by the joiner/s 91, 92, 93 and 94 can be interchangeable between the joiner type/s. The joiner 90 dimensions can be scaled up or down to adapt to the needs of the heatsink modules 10 they support.

FIG. 9 shows an exemplary top perspective view of a "cross" shaped type joiner 94. The elements shown include a hanger 67, a hanger track 96, a receptacle 37, a keyed joiner opening 73, heatsink anti-disengagement slotted bore/s 72, aircraft cable 95, a fastening device 71, a heatsink module 10, a device receptacle 75, a hanger bridge 98, a light source 1, a light redirecting optical lens 5, a dip switch, and a sensing device.

The joiner 90 can support two intersecting heatsink module arrays 100 (not shown) receiving power or power and data input to coupled devices 62 of the heatsink modular array 100 from the above. Encased inside joiner 90 are three device receptacles 75. One of the device receptacles 75 is full size and the two other device receptacles' 75 size is reduced. Unlike the full-size device receptacle 75 that electrically couple two heat sink modules 10, the reduced size device receptacles 75 couple to only one heatsink module 10.

The "cross" joiner 94 is most commonly suspended from above by aircraft cable/chain 95. Aircraft cable is a preferred means of suspension as it allows for mounting height adjustability. The cable 95, looped through an opening in the hanger 67, extends vertically to be coupled to a through a similar loop in a support harness 97 and/or a housing 99 above (not shown).

Slotted bores 72 in proximity to the ends of the joiner's 90 top surface (not shown) are configured to receive an anti-disengagement fastener device that secures the heatsink modules to the joiner while permitting lateral mobility to the heatsink modules without breaking the heatsink module's electrical connectivity.

Power or power and data to and from the device receptacles 75 can be conveyed from at least one support harness 97 and/or a housing 99 (not shown) above. The power or power and data conveyance between the device receptacles 75 and the support harness 97 and/or the housing 99 can be direct or can be jumped by a power/data conductor 85, 86 (not shown) between at least two device receptacles 75.

In at least one embodiment, an array 100 of heatsink modules 10 can be formed with multiple "crossed" type or "cross" 94 and "T" 93 (not shown) type joiners 90 to provide future versatility for rearranging floor furniture below. Further, the "cross" 94 type and the "T" 93 type joiners 90 can provide a tap-in location for other related or non-related 62 devices to the array 100. For example, power drawn from a device receptacle 75 of a "T" 93 type joiner 90 can illuminate a nearby suspended flat screen monitor (not shown).

FIG. 10 shows an exemplary bottom perspective view of a "cross" 94 shaped type joiner 90. The elements shown include, a receptacle 37, a partial heatsink module 10, a joiner 90, a sensing device 50, a light source 1, a light redirecting optical lens 5, heatsink module core/s 43, a cable/chain 95, a hanger 67, keyed mechanical protrusion 74, heat dissipating fins 13, a fastener 71, a bore 16, a dip switch 68, a full-size device receptacle 76 and a reduced size device receptacle 77.

The "cross" shaped type joiner is shown suspended from above by an aircraft cable 95. The aircraft cable is coupled to a hanger 67. The hanger 67 is coupled to the joiner 90. The inner walls of the joiner 90 have keyed mechanical protrusions 74 configured to reciprocate (or "marry") with protrusions/heat dissipating fins 74, 13 integrally formed in the side walls of the heatsink module 10.

The full-size device receptacle 76 is retained inside a main power branch circuit direction of the heatsink array 100, and two reduced size device receptacles 77, disposed perpendicularly to the main branch, are configured to convey power or power and data to two branch circuits of the array 100 (not shown).

The full-size device receptacle 76 shows a sensing device 50 coupled with power/data receptacles 37 at both sides. The receptacles 37 are configured to couple to other I/O devices 62. Threaded bores next to the receptacles 37 are configured to receive fasteners 71 that secure the coupled device 62 in place. In at least one embodiment, a dip switch 68 coupled to a surface of the device receptacle 75 can be configured to control at least one operational feature of a coupled electrical device 62.

Coupled to the top and bottom surfaces of the heatsink module 10, a continuous light redirecting optical lens 5 covers an array of light sources 1. The light sources 1 can be coupled to the bottom surface, the top surface, or both the top and bottom surfaces of the heatsink module 10. The light redirecting optical lens 5 can be configured to have a symmetrical and/or asymmetrical beam pattern, and a plurality of beam spread angle.

FIG. 11 shows a partial elevation of a heatsink module array 100 suspended from a electrical device 62 housing 99 that is suspended from a structure above. The elements shown include, a heatsink module 100, a device housing 99, a power or power and data cable conductor 85, 86, a sensing device 50, a hanger 67, a joiner 90, a power or power and data conductor 85, a housing 99, a cable/chain 95, heat dissipating fins 13, and a light redirecting optical lens 5.

The cable/chain 95 mechanically couples the joiner 90 of the heatsink module array 100 to the housing 99 that is located distally above. The vertical axis of the housing 99 is substantially aligned with the vertical axis of the device receptacle 75 disposed inside the joiner 90 below (shown in dashed line). A sensing device 50 is coupled to the bottom face of the device receptacle 75. At the opposite side of the sensing device 50, light redirecting optical lenses 5 are shown coupled to the bottom surfaces of the partial heatsink module 10 sections.

The joiner 90 with protrusions 74 disposed inside its inner walls keyed to reciprocate with protrusions 74/heat dissipating fins 13 on the exterior wall of the heatsink module 10 are configured to align and secure the elements of the heatsink module array 100. A hanger 67 shown is mechanically engaged by recessed tracks 78 at the opposite sides of the joiner's 90 top surface.

The hanger 67 is substantially aligned with the vertical axis of a support harness/housing 97, 99 above. An aircraft cable/chain 95 couples the housing 99 to the hanger 67 below. The aircraft cable/chain 95 can be adjustable to allow maintaining the correct mounting elevation along the length of the heatsink module array 100. Two cable conductors 85, 86 shown couple at least one power supply 52 (not shown) or a power supply and another power consuming device 62 to a device receptacle 75 below. The cable conductor 85, 86 can be detachable at least from one end.

In at least one embodiment, the housing 99 shown can have at least one door with hinges on one side and a latch on the other side. The housing 99 shown is supported from a structure above. In at least one other embodiment, at least one power or power and data conductor can access the housing 99 from other than through the device receptacle 75.

FIGS. 12A and 12B show a partial elevation and a transverse section of and through the joiner 90, with a device receptacle 75, respectively.

FIG. 12A shows a partial enlarged elevation of the joiner 90 encased inside a device receptacle 75 (shown in dashed lines). The elements shown include, a heatsink module 10, a device receptacle 75, a joiner 90, a hanger 67, aircraft cable 95, and a conductor cable 85, 86.

The joiner 90 is coupled by a hanger 67 to a support harness/housing 97, 99 (not shown) above, by a cable/chain 95. Two fasteners 71 disposed at the opposite sides of the lateral mobility of the joiner 90 (not shown). Detachable power or power and data cable conductors 85, 86 shown on both sides of the hanger 67 are configured to convey power or power and data between the support harness and/or the housing 97, 99 (not shown) and the device receptacle 75.

The device receptacle 75 profile can be fabricated to match the wall profile of the heatsink module 10 to provide a continuous architectural appearance, and the color of the device receptacle can be configured to match the color of the heatsink module 10.

FIG. 12B shows a transverse section through joiner 90 and the heatsink module 10 in front of the device receptacle 75. Elements shown include a joiner 90, a heatsink module 10, a hanger 67, a fastener 71, aircraft cable 95, a heatsink module core 43, a cable conductor 85, 86, a sensing device 50, and a light source 1 covered by a light redirecting optical lens 5.

The section location shows the slotted bore 72 in the joiner 90 that prevents the heatsink module 10 from disengaging from the joiner 90. A plurality of power or power and data through conductors 85 with local power or power and data local conductors 86 are shown in a central opening inside the heatsink module core 43. The conductors 43 convey through power and/or data downstream. The array's 100 (not shown) through power conductors 85 are tapped by local power and/or data conductors 86 that power at least one local electrical device 62.

In reference to FIG. 11, a light source 1 coupled to the bottom face of the heatsink module 10 is shown covered by a light redirecting optical lens 5. A sensing device 50 is shown coupled to the bottom of the device receptacle 75 beyond. At the top of the joiner 90, a partial section of a cable conductor 85, 86 is shown coupled to a device receptacle 75 beyond (not shown), with a hanger 67 behind. An opening in the hanger 67 is configured to receive a cable/chain 95 to secure the heatsink module array 100 to a support structure above.

FIG. 13 shows an enlarged partial perspective view of a joiner 90 with a device receptacle 75. The joiner 90 is shown cut back exposing the full-size device receptacle 75. The elements shown include, a joiner 90, a device receptacle 75, a hanger 67, a fastener 71, a hanger 67, a hanger bridge 98, a bore 16, a device receptacle fastening device 71, a receptacle 37, a keyed joiner opening 73, a sensing device 50, a camera 55, and a dip switch 68.

The joiner 90 can arrive at an installation location as a complete assembly, with the device receptacle 75 inside the joiner 90, or any one of the three components, joiner 90, the device receptacle 75, and the hanger 67 can arrive separately. Assembling these components entails sliding the device receptacle 75 through the joiner 90 until the fastening bores 16 in the device receptacle 75 align with the semi-circled cut-outs in the hanger bridge 98. The hanger bridge 98 is located between the two keyed joiner openings 73. Then the assemblage can proceed by sliding the hanger 67 into position between the two keyed joiner openings 73 and then securing the hanger 67 and the device receptacle 75 to the joiner 90 by screwing mechanical fasteners 71 to the threaded bores 16 located at the opposite side of the hanger 67. Once in place, the entire assemblage is secured and the hanger 67 is prevented from traveling laterally.

At the bottom of the figure a sensing device 50 is shown coupled to the bottom face of the device receptacle 75. The present figure shows a camera 55. In a different embodiment the device 62 can be at least one of, an emergency light source 1, an audio device 60, an occupancy sensor/photocell 49, a communication device 57, and an air quality probe. At least one power consuming device can couple to the bottom surface of the device receptacle 75.

In buildings where the structure is exposed to the below, it is preferred that the placement of the hanger 67 be vertically aligned with the structural members above. For this reason, it is recommended that the length of the heatsink modules 10 be configured to correspond to the spacing of the structural member from which the heatsink module array 100 (not shown) is to be suspended. Nonetheless, suspending the heatsink module array 100 can be accomplished by using at least one hanger 67 that is coupled to the heatsink module 10. More information about coupling a hanger to a heatsink module is described in the parent patent, FIG. 4, Element 67 shown herein.

FIGS. 14A and 14B show front and side elevations of an electronic device support harness 97 with coupled devices 62.

FIG. 14A shows an elevation of a support harness that is supported from a support structure above (not shown). The support harness 97 is coupled to the above support structure by at least one of, a cable, a chain, a conduit, a bar, a rod, or any other mechanical support member. The elements shown in this figure include, a support harness 97, a power consuming device 62, a mechanical fastener 71, aircraft cable 95, a suspension bore 79, and a power or data cable conductor 85, 86.

The present disclosure's power or power and data is conveyed from inside the interior of the heatsink modules 10, through a device receptacle 75 and through an external cable conductor/s 85, 86 to at least one power consuming device 62 that is coupled to the support harness 97.

The suspended from above support harness 97 relieves the heatsink module array 100 from induced stresses caused by otherwise coupled power consuming devices' 62 loads. Separating at least one of the power consuming devices 62 from the array by coupling it to the support harness 97, reduces the ambient heat in and around the heatsink array 100. This separation helps prolong the life of the array's 100 coupled power consuming devices 62.

The power consuming devices 62 can come in different dimensional sizes. The reduced form modular heatsink array 100 has minimal space allocated to couple a plurality of devices 62 and not all devices' size conforms to the array's allocated mounting surface without undermining the architectural appearance of the array 100. Therefore, it is preferred to couple the power consuming devices 62 externally onto the support harness 97. Further, the coupled power consuming devices 62 have dimensional and weight variability that can result in adversely affecting the light emitted directionality of the array 100.

The support harness 97 can support as many power consuming devices 62 as needed to at least operate the devices 62 coupled to the heatsink module array 100. The support harness dimensions and tensile strength can be sufficiently configured to support the weight of the heatsink modules 10 at spacing increments that the present disclosure limits to less than 12'-0". In other embodiments with different structural properties, the spacing increments can be greater.

A power or power and data conductor cable 85, 86 connects the power consuming devices 62 of the support harness 97 to the device receptacle 75 disposed inside the heatsink module 10 joiner 90 below. The conductor cable 85, 86 can be detachable from at least one end. The exposed support harness 97 enables easy accessibility for replacement of the power consuming devices 62 coupled when a device 62 fails.

Finally, the two-sided surface area of the support harness 97 accommodates for size and form variability of most power consuming device 62 types that the heatsink module array 100 alone and/or in conjunction with other nearby and/or remote, related and/or unrelated in functionality, may need to operate.

FIG. 14B shows a side view of the support harness 97 arrangement with the elements shown in FIG. 14A.

FIGS. 15A and 15B show front and side elevations of an electronic device housing 99 with coupled devices 62.

FIG. 15A shows an elevation of a housing 99 that is supported from a support structure above (not shown). The housing 99 is coupled to the above support structure by at least one of, a cable, a chain, a conduit, a bar, a rod, or any other mechanical support member. The support harness 97 can be enclosed and part of the housing 99. The elements shown in this figure include, a housing 99, a suspension bore opening 79, aircraft cable 95, a suspension bore 79, and a power or data cable conductor 85, 86.

The present disclosure's power or power and data is conveyed from inside the interior of the heatsink modules 10 (not shown), through a device receptacle 75 (not shown) and through an external cable conductor/s 85, 86 to at least one power consuming device 62 (not shown) that is coupled to the housing 99.

The suspended from above housing 99 relieves the heatsink module array 100 (not shown) from induced stresses caused by otherwise coupled power consuming devices' 62 loads. Separating at least one of the power consuming devices 62 from the array 100 by coupling it to the housing 99, reduces the ambient heat in and around the heatsink array 100. This separation helps prolong the life of the array's 100 coupled power consuming devices 62. It also can improve the performance of at least the coupled light source 1 of the array 100.

The power consuming devices 62 can come in different dimensional sizes. The reduced form modular heatsink array 100 has minimal space allocated to couple a plurality of devices 62 and not all devices' size conforms to the array's allocated mounting surface without undermining the architectural appearance of the array 100. Therefore, it is preferred to couple the power consuming devices 62 externally onto the housing 99. Further, the coupled power consuming devices 62 have dimensional and weight variability that can result in adversely affecting the light emitted directionality of the array 100.

The housing 99 can support as many power consuming devices 62 as needed to at least operate the devices 62 coupled to the heatsink module array 100. The support harness dimensions and tensile strength can be sufficiently configured to support the weight of the heatsink modules 10 at spacing increments that the present disclosure limits to less than 12'-0". In other embodiments with different structural properties, the spacing increments can be greater.

A power or power and data conductor cable 85, 86 connects the power consuming devices 62 of the housing 99 to the device receptacle 75 disposed inside the heatsink module 10 joiner 90 below. The conductor cable 85, 86 can be detachable from at least one end. The housing 99 enables easy accessibility for replacement of the power consuming devices 62 coupled when a device 62 fails.

Finally, the housing's 99 enclosure can accommodate for size and form variability of most power consuming device 62 types that the heatsink module array 100 alone and/or in conjunction with other nearby and/or remote, related and/or unrelated in functionality, may need to operate.

FIG. 15B shows a side view of the housing 99 arrangement with the elements shown in FIG. 15A.

FIG. 16A shows a vertical section through a domed lensed optics 117 that is positioned over a planar light source such as an LED lamp 110. The domed lensed optics 117 design can employ design principles associated with total internal reflection (TIR) technology. The domed lensed optics 117 is configured to control the intensity, magnitude, and directionality of light emitted through a relatively small light source 110 that can be planar.

The present lens 115 design depicts optics configured to be placed over an LED lamp 110 that is coupled to a surface of an EMHS section. More specifically, the lens 115 design is configured to be used in a light emitting device such as the EMHS mounted at a specific mounting height. Further, the lens 115 optical design can be configured to illuminate both horizontal and vertical surfaces of a racked aisle.

FIG. 16A shows the domed lens 117 coupled to a lens base 119. The domed lens base 119 can be configured to couple to a PCB with LED lamps 110 populated across. The vertical axis of each of the LED lamps 110 can be precisely aligned with an optical center of each of the domed lenses 117. The present figure shows an LED lamp 110 positioned at the center of the figure's bottom surface.

FIG. 16B shows a top view of a domed lensed 117 optics. The domed lensed optics shown is coupled to a lens base 119. In at least one embodiment, at least two domed lensed 117 optics can be coupled to at least one lens base 119. The lamp 110 shown at the center of the lensed dome 117 can directly couple to a surface of an EMHS or can couple to a PCB. A plurality of domed lenses 117 coupled to a single lens base 119 can be fabricated to precisely correspond to an array of LED lamps 110 coupled to a PCB below.

The optical distribution pattern of the light emitted through the domed lens 117 can be symmetrical, asymmetrical, or a combination of symmetrical and asymmetrical optics. The light distribution pattern through an array of domed lensed 117 optics coupled to an EMHS can be the same or different. Further, at least one of lamp 110 color, chromaticity, and light intensity can vary among lamps 110 disposed below the lensed domes 117.

FIGS. 16C, 16D, and 16E show different light emittance patterns that the domed lensed 117 optics can generate. These patterns represent typical patterns used by the construction industry. Nonetheless, the present lens optics innovation can also be configured to generate a myriad of light distribution patterns.

FIG. 16C shows a symmetrical horizontal round distribution pattern 112. In a different embodiment, the pattern can be shaped to generate a square distribution pattern. The present distribution round pattern 112 can be used in open floor areas or in open floor areas having a number of floor mounted low rise obstructions.

FIG. 16D shows an asymmetrical horizontal rectangular light emittance pattern 113 configured to be used in corridors and racked aisle spaces. It is noted that the present lensed optics simultaneously illuminates horizontal and vertical surfaces. The intensity of the light emitted over each of the surfaces is precisely configured. An additional novel design concept that can be incorporated into the lensed design is curtailment of glare causing high exit beam angles through the lens that are directed toward an aisle walkway. These high beam angles can be redirected by the lensed optics toward the rack of an aisle and/or a wall of a corridor.

FIG. 16E shows a mixed optical light emittance pattern 114 on the horizontal surface. The light emittance pattern 114 is comprised of a combination between a round emittance pattern and a rectangular emittance pattern. This emittance pattern is comprised of symmetrical and asymmetrical light emittance patterns. This pattern 114 can be used over bulkhead walls where an EMHS section is positioned parallel and adjacent to a vertical surface on one side and a horizontal surface that extends from the bottom of the vertical surface outwardly below and away from the EMHS. This type of lensed optics is configured to emit light over vertical and horizontal surfaces as the rectangular domed lens' emittance pattern.

FIG. 17A shows a light emittance pattern in the form of a transverse section across a domed optics light projection 131. This symmetrical pattern is configured to be used over aisle space where both vertical surfaces need to be equally illuminated. The pattern shows two narrow and deep legs extending downwardly from a top apex. The lamp covered by the domed lensed optics is positioned at the apex. These legs are configured to primarily illuminate the vertical surfaces, concentrating the most intense light over the inclusionary range subfield of illumination of the vertical surface.

The upside down "V" shaped pattern 131 shows that the light intensity is reduced between the two legs. The light emittance component between the two legs is directed toward the floor surface below. This component of the emitted light can be controlled to reduce or eliminate the glare component a human can encounter traversing a racked aisle. In racked environments where forklift operators stock goods on shelves above, reducing or eliminating the glare component in the aisle reduces eye strain while improving the safety of forklift operation.

FIG. 17B shows a longitudinal light emittance pattern 132 that is parallel to the orientation of the EMHS and an adjacent vertical surface. The section shows the pattern of light emittance over a vertical surface as viewed parallel to and below the longitudinal axis of the EMHS. The pattern 132 shown is wide and deep. This pattern infers that when a plurality of domed lenses with the same symmetrical distribution are configured to couple to a bottom surface of an EMHS in an array, the racked surfaces can be efficiently illuminated across the entire face of the vertical racked surface.

FIG. 18A shows in perspective view a domed lensed optics array 116 positioned above a PCB 111. The PCB 111 below includes a number of LED lamps corresponding to and placed directly below the lensed domes 117. The domed lensed array 116 with the PCB 111 can be configured to directly couple to a surface of the EMHS. The domed lensed array 116 is shown coupled to a common lens base 119. The lens base 119 can dimensionally overlap the PCB 111, stop short of the PCB 111 footprint, or overhang beyond at least one of the PCB 111 sides. The elements shown include a PCB 111 with lensed domes 117 coupled to a common lens base 119.

FIG. 18B shows in a partial enlarged section a lensed dome 117 positioned on top of a PCB 111 with a lamp 110 coupled to the PCB 111 top surface. The PCB 111 is shown coupled to the surface of the EMHS 100. Elements of the EMHS 100 shown include a through bore 101 that enables power or power and data conductors through passage, heat dissipating fins 108 that rapidly dissipate heat generated by the coupled LED lamp/s 100, and a channel/slot 104 that can retain at least a PCB 111 in place. The present section figure shows the lens base 119 extending above the PCB 111 with both elements retained inside the channel/slot 104.

FIG. 19A shows a perspective view of a device receptacle 105 coupled to partial sections of the EMHS 100 from both sides. The perspective view is from above, showing an extruded lens 118 coupled to the top surface 102 of the EMHS 100. Below the extruded lens 115, 118, at least one LED lamp 110 can directly or indirectly couple to the EMHS top surface 102.

The extruded lens 118 is configured to illuminate at least one surface above the EMHS 100. The lens 115, 118 can be shaped to have a plurality of beam spread widths. The beam spread width can vary based on the EMHS 100 distance from the surface above, the maximum to minimum uniformity ratio specified, and the light source's functional purpose. Other elements shown include a data conductor 109, a power conductor 107, and the EMHS 100 bottom surface 103. Below the device receptacle 105, a power consuming device is shown coupled.

The coupled device can be at least one of a sensing device 106, a communication device 134, a processing device 136, and/or an output device 137. The output device 137 can include an egress light source. Further, among the above listed power consuming devices, at least two of the devices can be integrated and can be housed in a single housing that is coupled to the device receptacle 105.

FIG. 19B shows in a perspective view a device receptacle 105 coupled to partial sections of the EMHS 100 from both sides. The perspective view is from below, showing an array of domed lenses 116. The domed lenses 117 are coupled to the bottom surface 103 of the EMHS 100. It is noted that this embodiment shows two lens 115 types being coupled to an EMHS 100.

At the top surface 102, an extruded lens 118 is coupled, wherein at the bottom surface 103 of the EMHS 100, a lensed dome 117 is coupled. Other elements shown include a data conductor 109, a power conductor 107, and the EMHS 100 bottom surface 103. Below the device receptacle 105, a power consuming device is shown coupled.

The coupled device can be at least one of a sensing device 106, a communication device 134, a processing device 136, and/or an output device 137. The output device can include an egress light source. Further, among the above listed power consuming devices, at least two of the devices can be integrated and can be housed in a single housing that is coupled to the device receptacle 105.

FIG. 20 shows a diagram of a racked aisle 127 cross section with vertical racked surfaces 120, 122, 124 at opposite sides of the aisle's walkway 125. An EMHS 100 shown above the aisle walkway 125 is configured to illuminate the vertical surfaces of the racks 12, 122, 124, the horizontal surface 130 of the aisle's walkway below 125, and a surface above the EMHS 133. The surface above the EMHS 133 can be horizontal or sloped. The present figure shows a horizontal surface above the EMHS 100.

It is noted that the EMHS 100 shown employs lamps that are coupled to the EMHS' 100 top and bottom surfaces. It is further noted that at least one of a lamp dedicated optical lens can cover an EMHS 100 lamp and an extruded lens can cover a plurality of lamps coupled to the EMHS 100 on the same or a different surface of the EHMS 100.

The present diagram shows vertices extending downwardly and upwardly from the EMHS 100. At least one optical lens with a lamp below positioned over and/or under an EMHS 100 surface is configured to differently illuminate each surface inscribed by a pair of vertices 120, 122, 124, 130, 133. The present diagram shows three vertical subfields of illumination over each of the racks' vertical surfaces 120, 122, 124. These subfields of illumination include the inclusionary range subfield 120, the subfield of illumination below the inclusionary range 120 referred to herein as the bottom vertical subfield 124, and the subfield of illumination above the inclusionary range 122 referred to herein as the top vertical subfield 122.

Directly below the EMHS 100 aligned with the nadir axis 123, an adult human 129 reference is shown traversing a horizontal surface 130 walkway 125. The adult human 129 eye level 121 is at 5'-0" above floor 125. This eye level height 121 is used as a reference for the design of the optical lens that is coupled to the EMHS 100. The eye level 121 reference projected onto the vertical surface 127 can constitute the vertical mid-point of the inclusionary range 120 top boundary of range 126 and bottom boundary of range 128.

It is noted that the optical lens design is configured to deliver a greater average illuminance level over the surface of the inclusionary range 120 than the average illuminance levels over the top and bottom vertical subfields of illumination 122, 124 above and below the inclusionary range subfield 120.

The optical lens designed to illuminate a racked aisle can have a rectangular light emittance pattern that is configured to provide widespread emitted light along the racked vertical surfaces 127, while emitting a less intense light over the aisle's walkway 125 at light beam exit angles exceeding 45° from the light source nadir 123. To mitigate apparent glare, light beam exit angles exceeding 45° can be directed toward the racks' vertical surfaces 120, 122, 124.

The present diagram also shows vertices extending up from the EMHS 100 toward a surface above 133 the EMHS 100. The beam angle spread shown is wide. The optical lens design of the lens positioned above the EMHS 100 lamp/s directing light upwardly 135 can be wider than the optical lens design of the EMHS 100 directing light downwardly. Both optical lenses' light emitted patterns shown in the present diagram are symmetrical.

It is noted that the lens design for at least the down light component of the EMHS 100 factoring the light directional distribution and the emitted light intensity level is primarily driven by targeting the inclusionary range vertical surface 120 and the adjacent aisle walkway 125 below. The optical lens design must factor for at least one of the lens height from the floor 125, the lateral and vertical distance from at least one vertical surface 127, the target light level specified for horizontal and vertical surfaces' illuminance 127, 130, the maximum to minimum uniformity ratio specified for a surface and/or the maximum to minimum uniformity ratio between at least two surfaces, and the maximum allowed uniform glare ratio.

FIG. 21 shows a diagram of a room cross section with a vertical surface 127 at one end. The EMHS 100 shown adjacent to and above the vertical surface 127 is configured to illuminate both the vertical surface 127 and horizontal surface 130 below. It is noted that the optical lens coupled to the bottom surface of the EMHS 100 is configured to direct light downwardly, illuminating at least one vertical surface 127 and at least one horizontal surface 130 below.

The present diagram shows vertices extending downwardly and outwardly from the EMHS 100. The optical lens design directing the light downwardly is configured to differently illuminate each surface inscribed by a pair of vertices. The present diagram shows three vertical subfields of illumination including the inclusionary range subfield 120, the subfield of illumination below the inclusionary range referred to herein as the bottom vertical subfield 124, and the subfield of illumination above the inclusionary range referred to herein as the top vertical subfield 122. It is noted that the latter subfield 124 may comprise a plurality of subfields. Aside from the vertical subfields, 120, 122, 124, 127, a horizontal subfield 130 extends away from the bottom end of the bottom subfield of illumination 124.

Directly below the EMHS 100 aligned with the nadir axis 123, an adult human 129 reference is shown traversing a horizontal surface walkway 125. The adult human 129 eye level 121 is at 5'-0" above floor 125. This eye level 121 height is used as a reference for the design of the optical lens that is coupled to the EMHS 100. The eye level reference projected onto the vertical surface 127 can constitute the vertical mid-point of the inclusionary range 120 with the top of boundary range 126 above and the bottom of boundary range 128 below.

It is noted that the optical lens design is configured to deliver a greater average illuminance level over the inclusionary range 120 than the average illuminance levels over the top and bottom vertical subfields of illumination 122, 124 above and below the inclusionary range subfield 120.

The optical lens emittance pattern used over the EMHS 100 lamp/s in the application as shown in the present diagram is referred to as mixed optics. This optical arrangement is asymmetrical, wherein on one side along the longitudinal axis of the EMHS 100 the lensed optics is configured to illuminate an adjacent vertical surface 127 and a horizontal surface 130 below, and at the opposite side of the longitudinal axis of the EMHS 100 the lensed optics is configured to illuminate a horizontal surface 130 only. The present diagram shows light emitted from the EMHS 100 downwardly. In other embodiments, light from the EMHS 100 can be emitted downwardly and upwardly.

While the concepts of the present disclosure are susceptible to various modifications and alternative forms, specific exemplary embodiments are been illustrated by way of example in the drawings and will be described. It should be understood, however, that there is no intent to limit the concepts of the present disclosure to the particular forms disclosed; on the contrary, the intention is to cover all modifications, equivalents, and alternatives falling within the spirit and scope of the invention as defined by the appended claims.

References in the specification to "one embodiment," "an embodiment," "an illustrative embodiment," etc., indicate that the described embodiment may include a particular feature, structure, or characteristic, but every embodiment may or may not necessarily include that particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Additionally, it should be appreciated that items included in a list in the form of "at least one A, B, and C" can mean (A); (B); (C): (A and B); (B and C); (A and C); or (A, B, and C). Similarly, items listed in the form of "at least one of A, B, or C" can mean (A); (B); (C): (A and B); (B and C); (A and C); or (A, B, and C).

The disclosed embodiments may be implemented, in some cases, in hardware, firmware, software, or any combination thereof. The disclosed embodiments may also be implemented as instructions carried by or stored on one or more transitory or non-transitory machine-readable (e.g., computer-readable) storage medium, which may be read and executed by one or more processors. A machine-readable storage medium may be embodied as any storage device, mechanism, or other physical structure for storing or transmitting information in a form readable by a machine (e.g., a volatile or non-volatile memory, a media disc, or other media device).

In the drawings, some structural or method features may be illustrated in specific arrangements and/or orderings. However, it should be appreciated that such specific arrangements and/or orderings may not be required. Rather, in some embodiments, such features may be arranged in a different manner and/or order than illustrated in the illustrative figures. Additionally, the inclusion of a structural or method feature in a particular figure is not meant to imply that such feature is required in all embodiments and, in some embodiments, may not be included or may be combined with other features.

While the disclosure has been illustrated and described in detail in the drawings and foregoing description, such an illustration and description is to be considered as exemplary and not restrictive in character, it being understood that only illustrative embodiments have been illustrated and described and that all changes and modifications that come within the spirit of the disclosure are desired to be protected.

There are a plurality of advantages of the present disclosure arising from the various features of the method, apparatus, and system described herein. It will be noted that alternative embodiments of the method, apparatus, and system of the present disclosure may not include all of the features described yet still benefit from at least some of the advantages of such features. Those of ordinary skill in the art may readily devise their own implementations of the method, apparatus, and system that incorporate one or more of the features of the present invention and fall within the spirit and scope of the present disclosure as defined by the appended claims.

ELEMENT LIST

| | |
|---|---|
| 1 Light Source | 5 Light Redirecting Optical Lens |
| 10 Heatsink Module | 12 Plug-in Device/Cover |
| 13 Heat Dissipating Fins | 16 Bore |
| 37 Receptacle | 43 Heatsink Module Core |
| 49 Occupancy Sensor | 50 Sensing Device |
| 51 Processor | 52 Power Supply |
| 55 Camera | 57 Communication Device |
| 60 Audio Device | 62 Electrical Device |
| 67 A Hanger | 68 Dip Switch |
| 71 Fastener | 72 Slotted Bore |
| 73 Keyed Joiner Opening | 74 Mechanical Protrusion |
| 75 Device Receptacle | 76 Full-size Device Receptacle |
| 77 Reduced Size Device Receptacle | 78 Recessed Track |
| 79 Hanger Suspension Bore | 81 Mounting Surface |
| 85 Power/Data Conductor | 86 Local Power Conductor |
| 90 Joiner | 91 "I" Joiner |
| 92 "L" Joiner | 93 "T" Joiner |
| 94 "Cross" Joiner | 95 Cable/Chain |
| 96 Hanger Bridge | 97 Support Harness |
| 98 Hanger Track | 99 Housing |
| 100 Heatsink | 101 Through Opening |
| 102 Top Surface | 103 Bottom Surface |
| 104 Channel/Slot | 105 Device Receptacle |
| 106 Sensing Device | 107 Power Conductor |
| 108 Heat Dissipating Fins | 109 Data Conductor |
| 110 Lamp | 111 PCB |
| 112 Round Distribution Pattern | 113 Rectangular Distribution Pattern |
| 114 Mixed Distribution Pattern | 115 Optical Lens |
| 116 Lensed Array | 117 Lens Dome |
| 118 Extruded Lens | 119 Lens Base |
| 120 Inclusionary Range | 121 Adult Human Eye Level |
| 122 Top Vertical Surface/s | 123 Nadir |
| 124 Bottom Vertical Surface/s | 125 Floor/Walkway/Aisle |
| 126 Top of Boundary Range | 127 Rack/Vertical Surface |
| 128 Bottom of Boundary Range | 129 Adult Human |
| 130 Horizontal Surface | 131 Aisle Optics Transverse View |
| 132 Aisle Optics Parallel View | 133 Surface Above Heatsink |
| 134 Communication Device | 135 Up-light Component |
| 137 Output Device | |

The invention claimed is:

1. An elongated heatsink system comprising:
a heatsink module having a first heatsink module section and a second heatsink module section that are aligned along a common longitudinal axis, the first heatsink module section and the second heatsink module section each have through-openings that extend internally along the common longitudinal axis;
electrical conductors that are disposed in the through-openings and that convey power, or power and data;
a device receptacle disposed between the first heatsink module section and the second heatsink module section and configured to convey power or power and data provided via the electrical conductors between the device receptacle at least one of
a power consuming device coupled to the device receptacle,
a device coupled to one of the first heatsink module section and the second heatsink module section and that is in proximity to the device receptacle, or
an external device in proximity to the device receptacle and at least one of the first heatsink module section and the second heatsink module section;
a lamp coupled to a surface of the heatsink module; and
a light redirecting optical lens positioned over the lamp and redirects light emitted from the lamp toward a vertical illuminated surface and a horizontal illuminated surface, wherein
the vertical illuminated surface comprises a first subfield of illumination that serves as an inclusionary range and a second subfield of illumination that is contiguous with the inclusionary range but excludes the inclusionary range, the second subfield of illumination is above or below the inclusionary range, and
an average vertical light level on a surface of the inclusionary range is greater than an average light level on the second subfield of illumination.

2. The elongated heatsink system of claim 1, wherein the average vertical light level on at least a portion of the vertical illuminated surface above the inclusionary range is greater than an average vertical light level on at least a portion of the vertical illuminated surface below the inclusionary range.

3. The elongated heatsink system of claim 1, wherein an average vertical light level on the portion of the vertical illuminated surface that is over the inclusionary range is greater than an average vertical light level over another subfield of illumination on the vertical illuminated surface above the inclusionary range.

4. The elongated heatsink system of claim 1, wherein an average vertical light level over the portion of the vertical illuminated surface below the inclusionary range is greater than an average light level of the portion of the vertical illuminated surface that is above the inclusionary range.

5. The elongated heatsink system of claim 1, wherein an average horizontal light level on a surface of a racked aisle adjacent to a vertical surface of a rack is equal to or greater than of average light level on the inclusionary range.

6. The elongated heatsink system of claim 1, wherein a light emittance distribution pattern of the light redirecting optical lens is set to be maximum with reference to an eye level of an adult human positioned in proximity to the vertical illuminated surface.

7. The elongated heatsink system of claim 1, wherein light rays that exit the light redirecting optical lens along the common longitudinal axis more than 45° from nadir are in part or in whole directed toward at least the vertical illuminated surface.

8. An elongated heatsink system comprising:
a heatsink module having a first heatsink module section and a second heatsink module section that are aligned along a common longitudinal axis, the first heatsink module section and the second heatsink module section each have through-openings that extend internally along the common longitudinal axis;
electrical conductors that are disposed in the through-openings and that convey power, or power and data;
a device receptacle disposed between the first heatsink module section and the second heatsink module section and configured to convey power or power and data between the device receptacle at least one of
a device coupled to one of the first heatsink module section and the second heatsink module section and that is in proximity to the device receptacle, or
an external device in proximity to the device receptacle and at least one of the first heatsink module section or the second heatsink module section;

a lamp and a light redirecting optical lens positioned over the lamp and below a top surface of the elongated modular heatsink, light emitted from the lamp and redirected by the light redirecting optical lens illuminates a vertical illuminated surface and a horizontal illuminated surface positioned under the elongated heatsink system, wherein an average light level on a first vertical subfield, which is an inclusionary range of the vertical illuminated surface, is greater than an average light level on a second vertical subfield of the vertical illuminated surface that is above or below the inclusionary range, and an average light level on an illuminated surface area above the heatsink module, a size of the illuminated surface area being defined by a width in a predetermined range, and a height in another predetermined range.

9. The elongated heatsink system of claim 8, wherein light from the elongated heatsink system along the common longitudinal axis more than 45° from nadir is in part or in whole directed toward the vertical illuminated surface.

10. The elongated heatsink system of claim 8, wherein an average vertical light level in the inclusionary range of the vertical illuminated surface is greater than an average horizontal light level on a horizontal surface above the elongated heatsink system.

11. The elongated heatsink system of claim 8, wherein under a first condition with the lamp coupled to a top surface of the elongated heatsink system and mounted parallel to and over an illuminated surface of a racked aisle, a light emittance pattern of the lamp and the light redirecting optical lens is wider than a second condition with the lamp mounted to a bottom surface of the elongated heatsink system so the light emittance pattern is directed downward toward the horizontal illuminated surface and the vertical illuminated surface.

12. The elongated heatsink system of claim 8, wherein the light redirecting optical lens comprises at least two different types of light distribution optical lenses.

13. The elongated heatsink system of claim 8, wherein the lamp comprises a LED lamp coupled to a surface of the elongated heatsink system, the LED lamp with the light redirecting optical lens is configured to emit more than 51% of emitted light in the UV spectrum.

14. The elongated heatsink system of claim 8, wherein the light redirecting optical lens comprises at least one domed optical lens placed over the lamp and aligned with a central vertical axis of the lamp.

15. An elongated heatsink system comprising:

a heatsink module having a first heatsink module section and a second heatsink module section that are aligned along a common longitudinal axis, the first heatsink module section and the second heatsink module section each have through-openings that extend internally along the common longitudinal axis;

electrical conductors that are disposed in the through-openings and that convey power, or power and data;

a device receptacle disposed between the first heatsink module section and the second heatsink module section and configured to convey power or power and data between the device receptacle at least one of a power consuming device coupled to the device receptacle, a device coupled to one of the first heatsink module section and the second heatsink module section and that is in proximity to the device receptacle, or an external device in proximity to the device receptacle and at least one of the first heatsink module section and the second heatsink module section;

at least one lamp is coupled to a floor facing surface of the heatsink module; and at least one light redirecting optical lens positioned over the at least one lamp and below the at least one lamp, light emitted through the at least one light redirecting optical lens is oriented to illuminate a vertical surface and a horizontal surface below the heatsink module, wherein, an average light level on the horizontal surface at floor level below the heatsink module is equal to or greater than an average light level on a first vertical subfield, which is an inclusionary range of the vertical illuminated surface, an average light received in the inclusionary range is greater than an average light level of a contiguous vertical subfield of illumination of the vertical illuminated surface, and an average light level of the contiguous vertical subfield of illumination below the inclusionary range is greater than an average light level of at least one vertical subfield of illumination above the inclusionary range including a contiguous subfield measured vertically.

16. The elongated heatsink system of claim 15, wherein the at least one lamp comprises a plurality of lamps controlled in unison or individually.

17. The elongated heatsink system of claim 15, wherein under a condition the elongated heatsink system is mounted over and parallel to a racked aisle, a glare component of light emitted by the at least one light redirecting optical lens does not exceed a sixteen uniform glare ratio value as viewed at eye level of an adult human observer located in a racked aisle.

18. The elongated heatsink system of claim 15, wherein the light redirecting optical lens comprises a plurality of lenses on a lens base that is configured to be retained in at least one channel or slot in a body of the elongated heatsink system.

19. The elongated heatsink system of claim 15, wherein the light redirecting optical lens comprises a single domed optical lens that is configured to emit at least two different light distribution patterns on the horizontal surface, below the elongated heatsink system.

20. The elongated heatsink system of claim 15, wherein the light redirecting optical lens is configured to direct light from one side of the elongated heatsink system toward the vertical illuminated surface and the horizontal illuminated surface and from the other side of the elongated heatsink system toward only another horizontal surface.

* * * * *